(12) United States Patent
Azuelos et al.

(10) Patent No.: US 10,796,048 B1
(45) Date of Patent: Oct. 6, 2020

(54) ADDING DELAY ELEMENTS TO ENABLE MAPPING A TIME DIVISION MULTIPLEXING CIRCUIT ON AN FPGA OF A HARDWARE EMULATOR

(71) Applicant: Synopsys, Inc., Mountain View, CA (US)

(72) Inventors: Nathaniel Azuelos, Modiin (IL); Alex Shot, Herzelia (IL); Daniel Geist, Haifa (IL)

(73) Assignee: SYNOPSYS, INC., Mountain View, CA (US)

( * ) Notice: Subject to any disclaimer, the term of this patent is extended or adjusted under 35 U.S.C. 154(b) by 0 days.

(21) Appl. No.: 16/010,264

(22) Filed: Jun. 15, 2018

Related U.S. Application Data

(60) Provisional application No. 62/521,202, filed on Jun. 16, 2017.

(51) Int. Cl.
  *G06F 30/331* (2020.01)
  *G06F 30/3312* (2020.01)
  *G06F 30/30* (2020.01)

(52) U.S. Cl.
  CPC ............ *G06F 30/331* (2020.01); *G06F 30/30* (2020.01); *G06F 30/3312* (2020.01)

(58) Field of Classification Search
  CPC ............ G06F 17/5027; G06F 17/5031; G06F 17/5045; G06F 30/3312; G06F 30/331; G06F 30/30
  See application file for complete search history.

(56) References Cited

U.S. PATENT DOCUMENTS

| | | | | |
|---|---|---|---|---|
| 5,572,710 A | * | 11/1996 | Asano | G06F 17/5022 703/15 |
| 5,920,712 A | * | 7/1999 | Kuijsten | G06F 17/5027 703/23 |
| 5,923,865 A | * | 7/1999 | Chilton | G06F 17/5027 703/23 |
| 6,446,249 B1 | * | 9/2002 | Wang | G06F 17/5027 326/38 |

(Continued)

OTHER PUBLICATIONS

Cherepacha et al., "DP-FPGA: An FPGA Architecture Optimized for Datapaths," VLSI Design, Architecture Optimization, 4(4):329-343, (1996).

(Continued)

*Primary Examiner* — Stacy Whitmore
(74) *Attorney, Agent, or Firm* — Alston & Bird LLP

(57) ABSTRACT

The independent claims of this patent signify a concise description of embodiments. A method of performing hardware emulation of a circuit design is presented. The method includes partitioning a first portion of the circuit design to a first configurable logic chip of a hardware emulator, adding a selection circuit to the circuit design in the first configurable logic chip, and selecting one of a first signal or a second signal during a first clock cycle. The first signal and the second signal are used in the circuit design. The method further includes storing a first value associated with the selected signal during a second clock cycle, and sending the first value to an output pin of the first configurable logic chip during a third clock cycle. This Abstract is not intended to limit the scope of the claims.

22 Claims, 6 Drawing Sheets

(56) References Cited

U.S. PATENT DOCUMENTS

| | | | | |
|---|---|---|---|---|
| 6,732,068 B2* | 5/2004 | Sample | ............. | G01R 31/2853 326/40 |
| 6,895,540 B2 | 5/2005 | Chen et al. | | |
| 7,353,162 B2* | 4/2008 | Huang | ............. | G06F 17/5027 703/17 |
| 7,353,259 B1* | 4/2008 | Bakke | ............. | G06F 9/44505 709/208 |
| 7,904,288 B1* | 3/2011 | Beausoleil | ............. | G06F 17/5027 703/23 |
| 7,937,259 B1* | 5/2011 | Chan | ............. | G06F 17/5027 703/28 |
| 8,479,142 B2* | 7/2013 | Borkovic | ............. | G06F 17/5045 370/321 |
| 9,154,137 B2* | 10/2015 | Olgiati | ............. | G06F 17/5027 |
| 9,195,784 B2* | 11/2015 | Tseng | ............. | G06F 17/5022 |
| 9,292,640 B1* | 3/2016 | Elmufdi | ............. | G06F 17/5027 |
| 9,298,866 B1* | 3/2016 | Elmufdi | ............. | G06F 17/5027 |
| 9,946,823 B2* | 4/2018 | Suresh | ............. | G06F 17/5027 |
| 10,127,339 B2* | 11/2018 | Larzul | ............. | G06F 17/5036 |
| 2003/0131325 A1* | 7/2003 | Schubert | ............. | G06F 17/5022 716/106 |
| 2005/0267730 A1* | 12/2005 | Kfir | ............. | G06F 17/5027 703/26 |
| 2006/0154350 A1* | 7/2006 | Kolbakov | ............. | C12P 1/04 435/139 |
| 2006/0200785 A1* | 9/2006 | Borkovic | ............. | G06F 17/5031 716/113 |
| 2007/0186078 A1* | 8/2007 | Ikeda | ............. | G06F 30/30 712/10 |
| 2011/0013650 A1* | 1/2011 | McElvain | ............. | G06F 17/5045 370/503 |
| 2011/0185241 A1* | 7/2011 | Erickson | ............. | G06F 30/34 714/724 |
| 2012/0044957 A1* | 2/2012 | Saunders | ............. | G06F 30/34 370/535 |
| 2013/0166269 A1* | 6/2013 | Narita | ............. | G06F 30/3312 703/14 |
| 2013/0290920 A1* | 10/2013 | Borkovic | ............. | G06F 17/5031 716/108 |
| 2014/0103959 A1* | 4/2014 | Andreev | ............. | H03K 19/018585 326/41 |
| 2015/0046144 A1* | 2/2015 | Suresh | ............. | G06F 17/5027 703/23 |
| 2015/0324512 A1* | 11/2015 | Teig | ............. | G06F 30/327 716/134 |
| 2016/0098504 A1* | 4/2016 | Larzul | ............. | G06F 17/5027 716/136 |
| 2016/0321387 A1* | 11/2016 | Emirian | ............. | G06F 17/5027 |
| 2016/0327609 A1* | 11/2016 | Larzul | ............. | G01R 31/31703 |
| 2017/0109466 A1* | 4/2017 | Guerin | ............. | G06F 17/5027 |
| 2017/0357743 A1* | 12/2017 | Larzul | ............. | G06F 17/5036 |
| 2018/0004877 A1* | 1/2018 | Bershteyn | ............. | G06F 17/5027 |
| 2018/0004878 A1* | 1/2018 | Hutton | ............. | G06F 17/5031 |

OTHER PUBLICATIONS

Francis, "Exploring Networks-on-Chip for FPGAs," University of Cambridge Computer Laboratory, Technical Report No. 828, ISSN 1476-2986, 121 pages, (2013). [Submitted Jul. 2009].

Schafer et al., "Synthesis of Multilevel Multiplexer Circuits for Incompletely Specified Multioutput Boolean Functions with Mapping to Multiplexer Based FPGA's," IEEE Transactions on Computer-Aided Design of Integrated Circuits and Systems, 12(11):1655-1664, (1993).

* cited by examiner

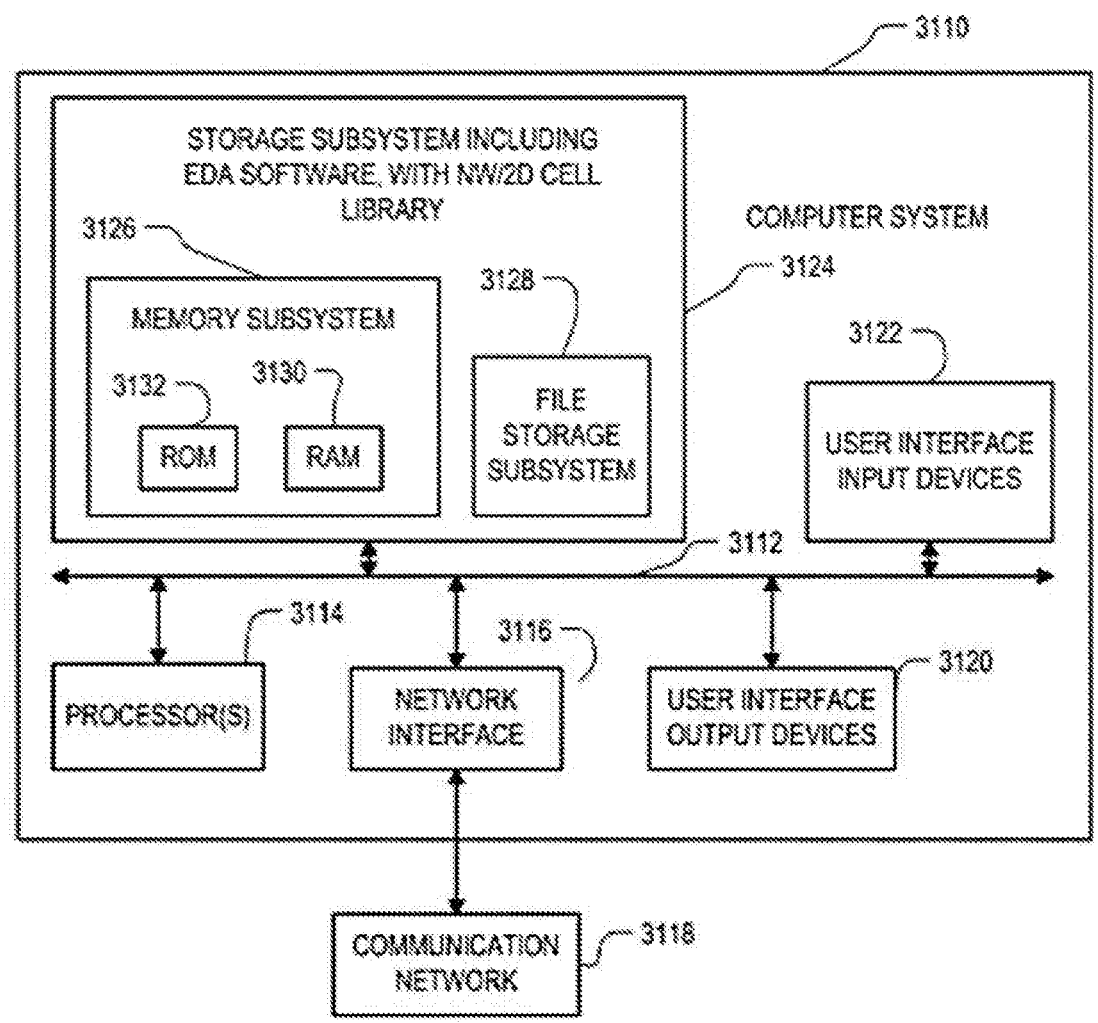
FIG. 6A
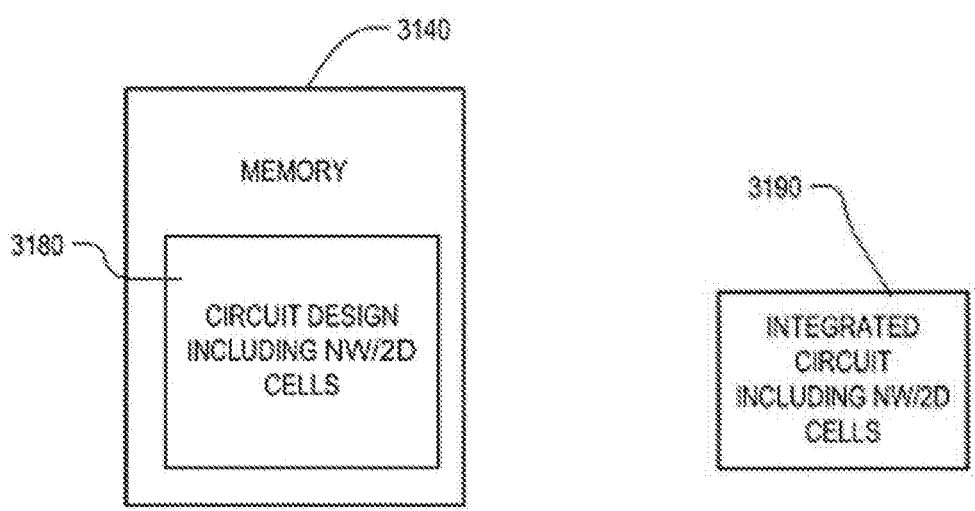
FIG. 6B
FIG. 6C

U S 10,796,048 B1

ADDING DELAY ELEMENTS TO ENABLE MAPPING A TIME DIVISION MULTIPLEXING CIRCUIT ON AN FPGA OF A HARDWARE EMULATOR

CROSS REFERENCE TO RELATED APPLICATIONS

The present application claims benefit under 35 USC 119(e) of Application Ser. No. 62/521,202, titled "ADDING DELAY ELEMENTS TO A VERY LARGE TIME DIVISION MULTIPLEXING STRUCTURE TO ALLOW SUCCESS OF MAPPING THIS STRUCTURE ON AN FPGA", filed Jun. 16, 2017, the contents of which is incorporated herein by reference in its entirety.

COPYRIGHT NOTICE

The assignee of this patent document has no objection to the facsimile reproduction by anyone of the patent document itself or of the patent application, as it appears in the files of the United States Patent and Trademark Office, but otherwise reserves all rights whatsoever in any included works of authorship protected by copyright.

SPECIFICATION—DISCLAIMER

In the following Background, Summary, and Detailed Description, headings should not be construed as necessarily limiting. In the following Background, Summary and Detailed Description, the citation or identification of any publication does not signify relevance or status as prior art for any of the claimed or described embodiments. Paragraphs for which the text is all italicized signifies text that is common to multiple Synopsys patent specifications.

BACKGROUND

Integrated circuit (IC) designers commonly describe their designs in a hardware description language (HDL) such as Verilog, VHDL, SystemC, and the like. Hardware emulation refers to the process of replicating behavior of one or more pieces of hardware, hereinafter also referred to as a design under test (DUT), with another piece of hardware, such as a special-purpose emulation system. An emulation model is usually generated in accordance with a hardware description language source code representing the design under test. The emulation model is compiled into a format used to program the emulation system. Running the emulation system that has been programmed enables debugging and functional verification of the design under test. Overall progress of the emulation is usually controlled by a master clock signal generated by the emulator hardware.

An IC designer may use an emulation system at various stages of a design process to verify that the IC functions and behaves as expected. As an example, a designer may develop a test bench for an emulation system by programming it to emulate a DUT. The system may indicate how the various internal or external signals of the DUT change states over time and thereby allow the monitoring of such signals and the behavior of the DUT during the emulation.

The system may generate a dump file containing waveform data representing the time-varying characteristics of monitored signals. The designer may then use any number of debugging tools to analyze the dump file and determine whether the DUT has behaved as expected. A need continues to exist for an improved hardware emulation system.

SUMMARY

The claims signify a brief description of one or more of the innovations, embodiments, and/or examples found within this disclosure.

According to one embodiment of the present invention, a method of performing hardware emulation of a circuit design is presented. The method includes partitioning a first portion of the circuit design to a first configurable logic chip of a hardware emulator, adding a selection circuit to the circuit design in the first configurable logic chip, and selecting one of a first signal or a second signal during a first clock cycle. The first signal and the second signal are used in the circuit design. The method further includes storing a first value associated with the selected signal during a second clock cycle, and sending the first value to an output pin of the first configurable logic chip during a third clock cycle, when the hardware emulator is configured to emulate the circuit design.

According to one embodiment, the first clock cycle is the same as the second clock cycle. The third clock cycle occurs after the first clock cycle. According to one embodiment, the first clock cycle is the same as the third clock cycle. The first clock cycle occurs after the second clock cycle. According to one embodiment, the selecting, the storing and the sending alleviates a constraint of the first configurable logic chip.

According to one embodiment, the method further includes storing a second value associated with the selected signal. The first value is associated with the first signal and the second value is associated with the second signal. The method further includes sending the second value to the output pin of the first configurable logic chip during a fourth clock cycle after the third clock cycle.

According to one embodiment, the method further includes sending the first value and the second value to the output pin of the first configurable logic chip in a predetermined order of clock cycles after a clock cycle associated with an invalid value on the output pin. According to one embodiment, the method further includes using time division multiplexing to send the first value and the second value to the output pin of the first configurable logic chip after a clock cycle associated with an invalid value on the output pin.

According to one embodiment, the method further includes configuring the selection circuit as a multiplexer, and inputting the first signal and the second signal to the multiplexer. According to one embodiment, the method further includes adding a first delay element to the circuit design in the first configurable logic chip, and storing the first value on an output of the first delay element.

According to one embodiment, the method further includes adjusting a clock period of the hardware emulation by adding to a first clock period the product of the total number of delay elements along a path from the first signal to the output pin times a latency time associated with one of the delay elements. According to one embodiment, the first delay element is a flip flop that synchronously stores on an output of the flip flop the first value present at an input of the flip flop in accordance with a clock signal.

According to one embodiment, the method further includes configuring the selection circuit to include a first sub-selection circuit configured to receive the first signal and the second signal, and a second sub-selection circuit configured to receive a third signal and a fourth signal. The third signal and the fourth signal are used in the circuit design. the selection circuit is further configured to include a third sub-selection circuit configured to receive a first selected signal from the first sub-selection circuit and a second selected signal from the second sub-selection circuit. The method further includes sending the first value from the third sub-selection circuit to the output pin of the first configurable logic chip.

According to one embodiment, the method further includes adding a first delay element to the circuit design between the first sub-selection circuit and the third sub-selection circuit, and adding a second delay element to the circuit design between the second sub-selection circuit and the third sub-selection circuit. According to one embodiment, the method further includes adding a first delay element to the circuit design between the first sub-selection circuit and the third sub-selection circuit, and coupling the second sub-selection circuit to the third sub-selection circuit without adding any delay element therebetween.

According to one embodiment, the method further includes adding a first control circuit to the circuit design configured to control the first sub-selection circuit, and adding a second control circuit to the circuit design configured to control the second sub-selection circuit. The second control circuit is different from the first control circuit.

According to one embodiment, the method further includes partitioning a second portion of the circuit design to a second configurable logic chip of the hardware emulator, adding a receiver circuit to the circuit design in the second configurable logic chip, and receiving the first value at an input pin of the second configurable logic chip during the third clock cycle after a clock cycle associated with an invalid value on the input pin.

According to one embodiment, the method is applied usefully in commerce by enabling the method in an article of manufacture including one or more processors each including one or more modules or computers for transforming information, where the modules are either mostly configured by a manufacturer, configured, at least in part, by a user, or configured by both the manufacturer and the user.

According to one embodiment of the present invention, a hardware emulation system is configured to partition a first portion of the circuit design to a first configurable logic chip of a hardware emulator, add a selection circuit to the circuit design in the first configurable logic chip, and select one of a first signal or a second signal during a first clock cycle. The first signal and the second signal are used in the circuit design. The hardware emulation system is further configured to store a first value associated with the selected signal during a second clock cycle, and send the first value to an output pin of the first configurable logic chip during a third clock cycle, when the hardware emulator is configured to emulate the circuit design.

According to one embodiment, the hardware emulation system is further configured to store a second value associated with the selected signal. The first value is associated with the first signal and the second value is associated with the second signal. The hardware emulation system is further configured to send the second value to the output pin of the first configurable logic chip during a fourth clock cycle after the third clock cycle.

According to one embodiment, the hardware emulation system is further configured to send the first value and the second value to the output pin of the first configurable logic chip in a predetermined order of clock cycles after a clock cycle associated with an invalid value on the output pin. According to one embodiment, the hardware emulation system is further configured to use time division multiplexing to send the first value and the second value to the output pin of the first configurable logic chip after a clock cycle associated with an invalid value on the output pin.

According to one embodiment, the hardware emulation system is further configured to configure the selection circuit as a multiplexer, and input the first signal and the second signal to the multiplexer. According to one embodiment, the hardware emulation system is further configured to add a first delay element to the circuit design in the first configurable logic chip, and store the first value on an output of the first delay element. According to one embodiment, the hardware emulation system is further configured to adjust a clock period of the hardware emulation by adding to a first clock period the product of the total number of delay elements along a path from the first signal to the output pin times a latency time associated with one of the delay elements.

According to one embodiment, the hardware emulation system is further configured to configure the selection circuit to include a first sub-selection circuit configured to receive the first signal and the second signal, and a second sub-selection circuit configured to receive a third signal and a fourth signal. The third signal and the fourth signal are used in the circuit design. The selection circuit further includes a third sub-selection circuit configured to receive a first selected signal from the first sub-selection circuit and a second selected signal from the second sub-selection circuit. The hardware emulation system is further configured to send the first value from the third sub-selection circuit to the output pin of the first configurable logic chip.

According to one embodiment, the hardware emulation system is further configured to add a first delay element to the circuit design between the first sub-selection circuit and the third sub-selection circuit, and add a second delay element to the circuit design between the second sub-selection circuit and the third sub-selection circuit. According to one embodiment, the hardware emulation system is further configured to add a first delay element to the circuit design between the first sub-selection circuit and the third sub-selection circuit, and couple the second sub-selection circuit to the third sub-selection circuit without adding any delay element therebetween.

According to one embodiment, the hardware emulation system is further configured to add a first control circuit to the circuit design configured to control the first sub-selection circuit, and add a second control circuit to the circuit design configured to control the second sub-selection circuit. The second control circuit is different from the first control circuit.

According to one embodiment, the hardware emulation system is further configured to partition a second portion of the circuit design to a second configurable logic chip of the hardware emulator, add a receiver circuit to the circuit design in the second configurable logic chip, and receive the first value at an input pin of the second configurable logic chip during the third clock cycle after a clock cycle associated with an invalid value on the input pin.

According to one embodiment of the present invention, a more efficient/useful method for performing hardware emulation of a circuit design is presented. The method includes partitioning a first portion of the circuit design to a first configurable logic chip of a hardware emulator, adding a selection circuit to the circuit design in the first configurable logic chip, and selecting one of a first signal or a second signal during a first clock cycle. The first signal and the second signal are used in the circuit design. The method further includes storing a first value associated with the selected signal during a second clock cycle, and sending the first value to an output pin of the first configurable logic chip during a third clock cycle, thereby alleviating a constraint of the first configurable logic chip, when the hardware emulator is configured to emulate the circuit design.

This Summary does not attempt to completely signify any particular innovation, embodiment, or example as it can be used in commerce. Additionally, this Summary is not intended to signify essential elements of an innovation, embodiment or example or to limit the scope of the subject matter of this disclosure.

The innovations, embodiments, and/or examples found within this disclosure are not all-inclusive, but rather describe the basic significance of the subject matter. Accordingly, one use of this Summary is as a prelude to a Detailed Description presented later.

DRAWINGS

The following Detailed Description, Figures, appended Additional Figures and appended Claims signify the nature and advantages of the innovations, embodiments and/or examples of the claimed inventions. All of the Figures signify innovations, embodiments, and/or examples of the claimed inventions for purposes of illustration only and do not limit the scope of the claimed inventions. Such Figures are not necessarily drawn to scale, and are part of the Disclosure.

In the Figures, similar components or features may have the same, or similar, reference signs in the form of labels (such as alphanumeric symbols, e.g., reference numerals), and may signify similar or equivalent functionality. Further, various components of the same type may be distinguished by following the reference label by a dash and a second label that distinguishes among the similar components. If only the first reference label is used in the specification, the description is applicable to any one of the similar components having the same first reference label irrespective of the second reference label. A brief description of the Figures is below.

FIG. 6A depicts various components of a computer system used in accordance with some embodiments of the present invention.

FIG. 6B depicts a simplified high-level block diagram of a memory used in accordance with some embodiments of the present invention.

FIG. 6C depicts a simplified high-level block diagram of a circuit that is emulated using a hardware emulation system, in accordance with one embodiment of the present invention.

DETAILED DESCRIPTION

Figure 1:
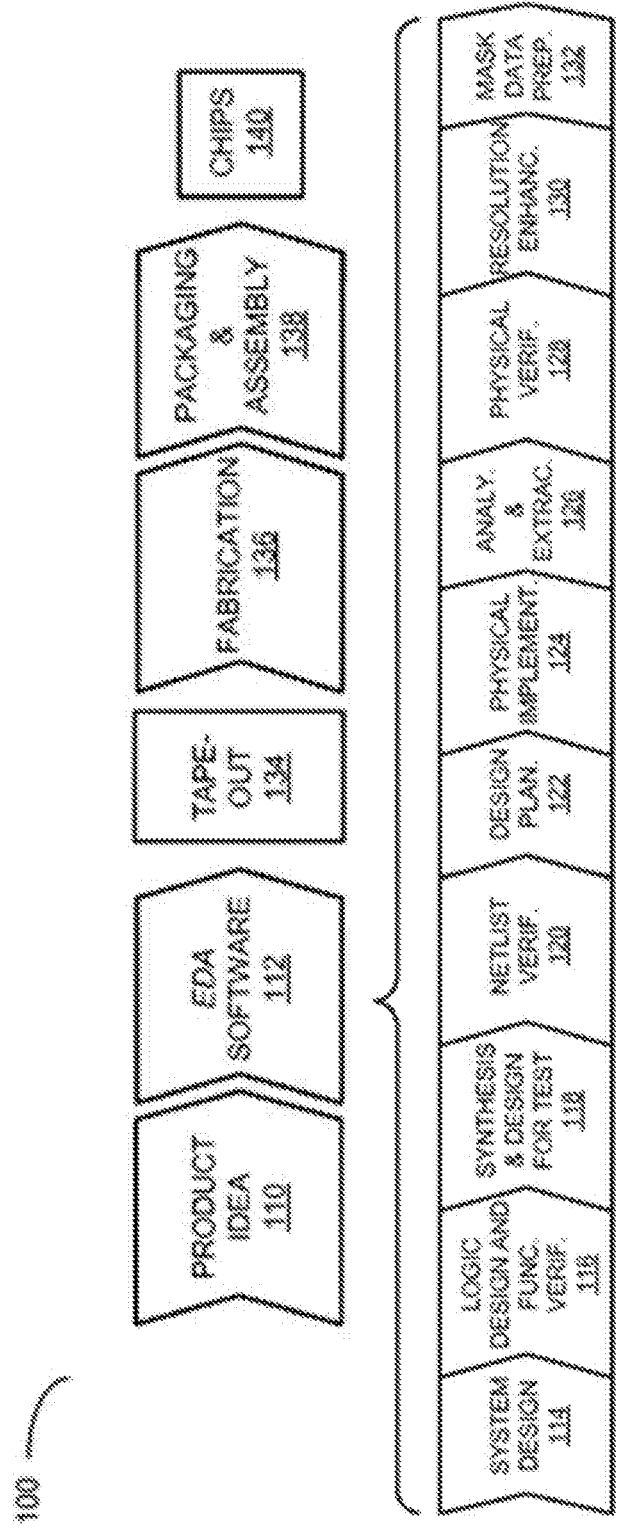
FIG. 1 depicts a multitude of processes performed in the design and fabrication of an integrated circuit.

The Figures and the following Detailed Description signify innovations, embodiments and/or examples by way of illustration only, with various features, structures or characteristics described together in a single embodiment to streamline the disclosure. Variations of any of the elements, processes, machines, systems, manufactures or compositions disclosed by such exemplary innovations, embodiments and/or examples will be readily recognized and may be used in commerce without departing from the principles of what is claimed. The Figures and Detailed Description may also signify, implicitly or explicitly, advantages and improvements of a subset of the exemplary embodiments described herein.

In the Figures and Detailed Description, numerous specific details may be described to enable one or more of the exemplary innovations, embodiments and/or examples. In the interest of not obscuring the presentation of the exemplary innovations, embodiments and/or examples in the following Detailed Description, some processing steps or operations that are known in the art may be combined together for presentation and for illustration purposes and might not be described in detail. However, a person skilled in the art will recognize that these exemplary innovations, embodiments and/or examples may be used in commerce without these specific details or with equivalents thereof. In other instances, well-known processes and devices are not described in detail as not to unnecessarily obscure aspects of these exemplary innovations, embodiments and/or examples. In other instances, some processing steps or operations that are known in the art may not be described at all. Instead, the following description is focused on the distinctive features or elements of various exemplary innovations, embodiments and/or examples. Furthermore, while this description may refer to some components of the structure in the singular tense, more than one component may be depicted throughout the Figures and like components are labeled with like numerals.

"CHL" in this context refers to 'configurable hardware logic', electronic hardware having physical interconnections that can be re-configured over and over for particular purposes. Circuit boards including multiple FPGAs are one example of CHL.

"FPGA" in this context refers to 'field programmable gate array', a type of CHL including logic blocks that can be re-wired in the field (after hardware manufacturing). An FPGA configuration is generally specified using a hardware description language (HDL). FPGAs contain an array of programmable logic blocks, and a hierarchy of reconfigurable interconnects that allow the blocks to be electrically interconnected into different configurations. Logic blocks can be interconnected to perform complex combinational functions. In many FPGAs, logic blocks also include memory elements, which may be simple flip-flops (FFs) or more complex blocks of memory.

"HDL" in this context refers to 'hardware description language', a specialized computer language used to describe the structure and behavior of electronic circuits. HDL enables a precise, formal description of an electronic circuit that allows for the automated analysis and simulation of an electronic circuit. It also allows for the synthesis of a HDL description into a netlist (a specification of physical electronic components and how they are connected together), which can then be placed and routed to define an integrated circuit.

"Net, or path" in this context refers to a connection in the netlist from one electrical component or terminal to another. The terms net, or path are used interchangeably herein. Further, it is understood that when referring to net, or path it is the computer data representing a physical conductive trace and not the physical conductive trace itself that is being described unless a physical connection is specifically called out. For example, a socket (defined below) is a physical connection that may use metal conductors such as traces, pads, or pins to electrically connect between a pair of CHLs. Further, one or more paths, represented as data in a netlist, may be mapped by software in the compiler to physical wire traces in the pair of CHLs and the socket connecting the pair of CHLs in order to conduct electrical signals when the hardware system containing the pair of CHLs is run.

"Wire" in this context refers to data representing a subset or segment of a path.

"LVDS" in this context refers to 'low-voltage differential signaling', a technical standard that specifies electrical characteristics of a low-voltage differential serial communications protocol.

"Programmable device" in this context refers to an integrated circuit designed to be configured and/or reconfigured after manufacturing. Programmable devices may include programmable processors, such as field programmable gate arrays (FPGAs) and/or any other type programmable devices. Configuration of the programmable device is specified using computer code, such as a hardware description language (HDL), for example Verilog, VHDL, or the like. A programmable device may include an array of programmable logic blocks and a hierarchy of re-configurable interconnects that enable the programmable logic blocks to be coupled to each other per the descriptions in the HDL code. Each of the programmable logic blocks can be configured to perform complex combinational functions, or simple logic gates, such as AND and XOR logic blocks. In most FPGAs, logic blocks also include memory elements, which may be simple latches, FFs, i.e. "flops," or more complex blocks of memory. Depending on the length of the interconnections or the data representing their associated paths between different logic blocks, signals may arrive at input terminals of the logic blocks at different times. Hardware emulation and/or prototyping systems may utilize one or more programmable devices.

"Socket" in this context refers to a physical electrical connection or communication port or interface between a pair of CHL. For example, an FPGA socket may also be referred to as an input/output pin or an FPGA pad. A socket may include communication and control circuitry on each of the CHL in the pair that are connected by a physical wire in the hardware system. When communicating data such as from CHL A to CHL B of a pair of CHL, parts of the socket may be called an "output socket" on CHL A and called an "input socket" on CHL B. When data representing a wire is assigned to a socket, then the path associated with that wire is implicitly assigned the same socket since the wire is a segment of the associated path.

"Time division multiplexing (TDM)" in this context refers to allocating the data representing or the physical utilization of a physical wiring or circuit resource into different distinct time slots.

"Multiplexing structure, multiplexer tree, or Mux tree" refers to a digital circuit composed of MUX elements. Each MUX element contains two or more data inputs and a select input which will determine which one of the data inputs will propagate to an output of the MUX element.

"Partitioning" in this context refers to splitting the design onto the a multitude of CHLs.

"Routing" in this context refers to coupling wires from one part of the circuit design under test that is mapped on one CHL, e.g. CHL A, to another part of the design under test that is mapped on a different CHL, e.g. CHL B. Routing may involve several hops across other intermediate CHLs, e.g. not CHL A or B. Because of physical connectivity constraints, not all CHL pairs, e.g. CHL A, B, may be directly connected to one another.

"Pin assignment" in this context refers to assigning specific design wires to specific physical CHL communication ports called "sockets."

"VLSI" in this context refers to 'very large scale integration', a single circuit chip package including, typically, hundreds of thousands, millions, or even billions of individual circuits.

"Design Frequency" or "driving clock" refers to the frequency in which the emulated design clock is driven with.

Figure 2:
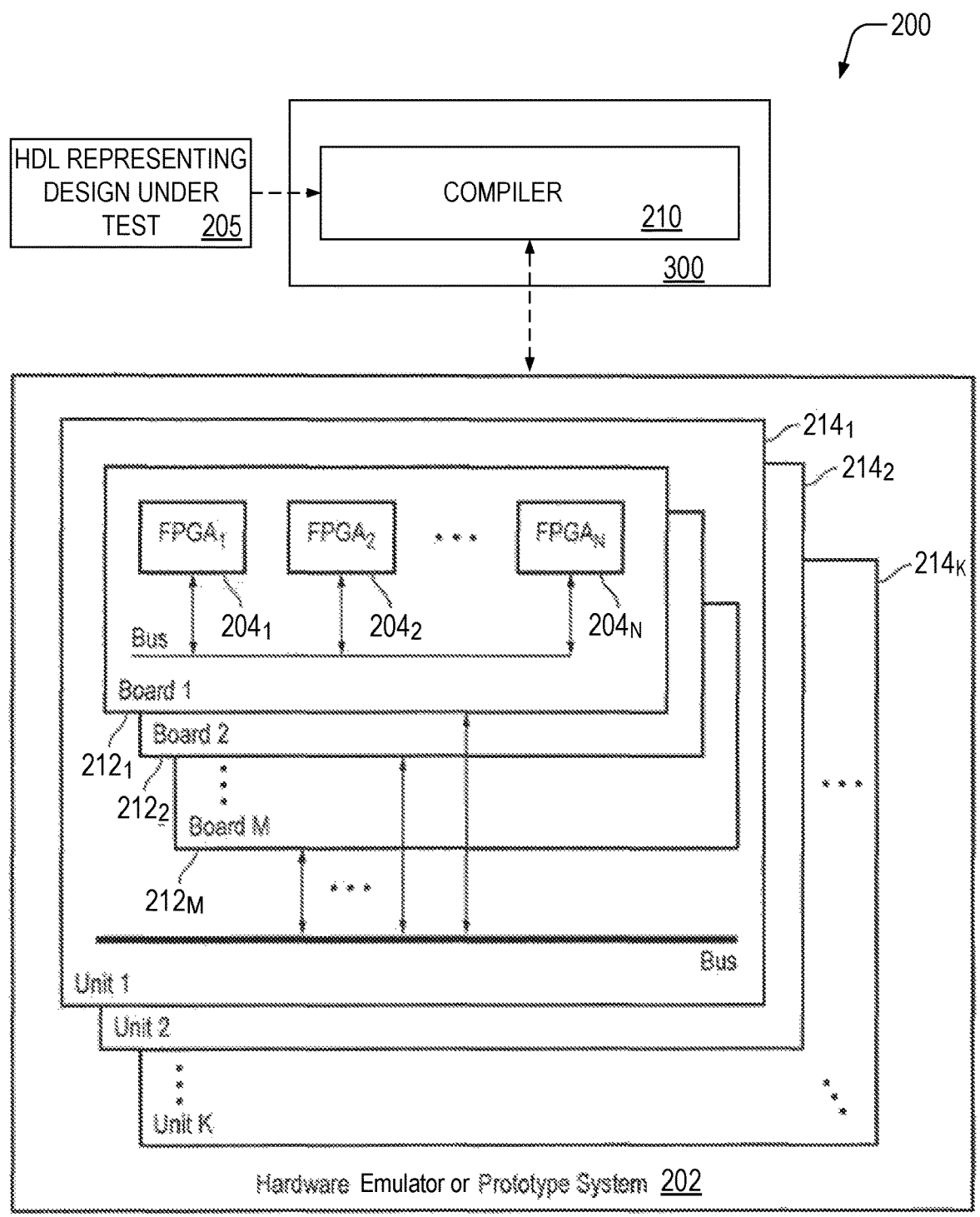
FIG. 2 depicts an exemplary high-level block diagram of a hardware verification system, in accordance with one embodiment of the present invention.
Figure 3:
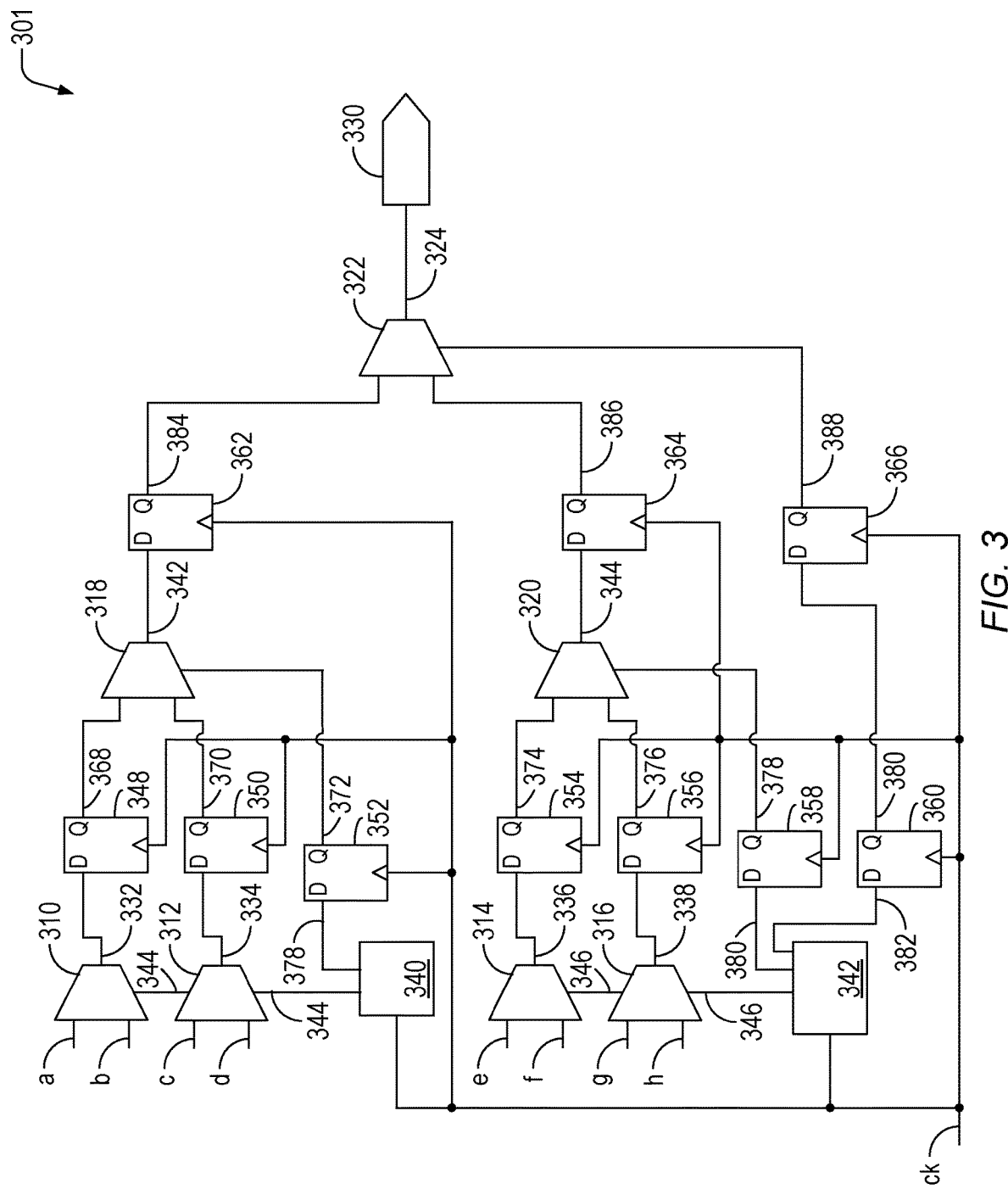
FIG. 3 depicts a simplified exemplary schematic of a selection circuit, in accordance with one embodiment of the present invention.

FIG. 3 depicts a simplified exemplary schematic of a selection circuit 301, in accordance with one embodiment of the present invention. Hardware emulator or prototype system 202 may partition a portion of circuit design 205 to a configurable logic chip, such as FPGA $204_1$ of hardware emulator or prototype system 202 depicted in FIG. 2. Referring simultaneously to FIG. 2 and FIG. 3, selection circuit 301 may be added to circuit design 205 in $FPGA_1$ $204_1$. It is noted that selection circuit 301 may not initially be part of circuit design 205 but is added by compiler 210 when hardware emulator and prototype system 202 is configured to emulate circuit design 205 as explained below.

Selection circuit 301 may include a multitude of multiplexers 310, 312, 314, 316, 318, 320, 322, coupled to an output socket 330. Output socket 330 may be directly connected by physical wire, trace, or optical fiber to an input socket located on another CHL or FPGA, such as for example $FPGA_2$ $204_2$ of hardware emulator or prototype system 202.

The multitude of multiplexers 310, 312, 314, 316, 318, 320, 322 may be divided into three levels of multiplexers. The first level of multiplexers may include multitude of multiplexers 310, 312, 314, 316. The second level of multiplexers may include multitude of multiplexers 318, 320. The third level of multiplexers may include multiplexer 322. The first, second, and third level of multiplexers may be configured to form a multiplexer tree with the "root" of the tree at third level multiplexer 322 and with the "leaves" of the tree at the multitude of first level multiplexers 310, 312, 314, 316.

Each of the multitude of multiplexers 310, 312, 314, 316, 318, 320, 322 may include at least two data inputs, a select input, and an output. A multitude of inputs of the first level of multiplexers receive a multitude of wire signals a, b, c, d, e, f, g, h, which may be used in circuit design 205. For example, multiplexer 310 receives wire signals a, b and generates multiplexer output 332; multiplexer 312 receives wire signals c, d and generates multiplexer output 334; multiplexer 314 receives wire signals e, f and generates multiplexer output 336; and multiplexer 316 receives wire signals g, h and generates multiplexer output 338. The outputs of the first level multiplexers are coupled as inputs to the second level multiplexers. For example, multiplexer output 332 and multiplexer output 334 are coupled to inputs of multiplexer 318; multiplexer output 336 and multiplexer output 338 are coupled to inputs of multiplexer 320. The outputs of the second level multiplexers are coupled as inputs to the third level multiplexer. For example, multiplexer output 342 and multiplexer output 344 are coupled to inputs of multiplexer 322. The output of third level multiplexer 322 or a multiplexer output 324 drives output socket 330.

A complication of pin assignment during partitioning circuit design 205 is that more than one wire, such as for example wire signals a, b, c, d, e, f, g, h, may map onto the same socket, e.g. output socket 330, because the number of physical sockets is typically smaller than the number of wires to be assigned. One solution to this problem utilizes time division multiplexing (TDM) hereinafter also referred to as "multiplexing".

Emulation provides an advantage that, when circuit design 205 is partitioned or mapped onto a multitude of CHLs, circuit design 205 may be emulated by driving the set of mapped clock signals of circuit design 205 at given or emulation frequencies that are different from the original clock frequencies intended for circuit design 205. Note that these given frequencies may be smaller than the maximum frequencies at which the CHLs may be driven. However, the time taken to run an emulation cycle by hardware emulator or prototype system 202 is much shorter than the time taken to run a simulated clock cycle via software alone. Further, in the course of mapping circuit design 205, there is another flexibility to map a path of circuit design 205 that takes a single clock cycle when intended to run in circuit design 205, to a path on the CHLs that spans several CHL clock cycles run during emulation.

TDM takes advantage of the above flexibility by mapping a single clock cycle of circuit design 205 into a multitude of clock cycles in hardware emulator or prototype system 202. During the single clock cycle of circuit design 205, multitude of wire signals a, b, c, d, e, f, g, h (8 wire signals) may all propagate through circuit design 205 in parallel to their respective destinations without any multiplexing. In contrast, when circuit design 205 is partitioned and mapped into the hardware emulator or prototype system 202, the pin assignment maps multitude of wire signals a, b, c, d, e, f, g, h to output socket 330 and compiler 210 generates additional associated circuitry that performs TDM. TDM is then performed by serially selecting each of the multitude of wire signals a, b, c, d, e, f, g, h and synchronously sending the selected wire signal one at a time to output socket 330 over at least 8 clock cycles of hardware emulator or prototype system 202. Each of the multitude of wire signals a, b, c, d, e, f, g, h may be mapped onto the single wire associated with the socket at different times using TDM.

Further, TDM may divide a larger time unit (e.g., 1 second) into multiple smaller time units (e.g., 1/100 of a second). At each small time unit, e.g. during each of the at least 8 clock cycles, data associated with each different one of the multitude of wire signals a, b, c, d, e, f, g, h is synchronously transmitted over a socket pin during associated different time slots. The sender circuits, e.g. selection circuit 301, and receiver circuits of signals over the socket pin synchronously coordinate to associate the different wires with TDM time slots during the at least 8 clock cycles.

Selection circuit 301 further includes a select signal generator 340 that synchronously controls multiplexers 310, 312, 318 and a select signal generator 342 that synchronously controls multiplexers 314, 316, 320, 322. In one embodiment, select signal generator 340 and select signal generator 342 include clock inputs connected to a clock signal ck. In one embodiment, compiler 210 adds select signal generator 340 to circuit design 205 configured to control, in-part, multiplexer 310, and adds a select signal generator 342 to circuit design 205 configured to control, in-part, multiplexer 314. For reasons discussed below, the select signal generator 342 is different from select signal generator 340. In another embodiment, select signal generator 340 may be the same circuitry as select signal generator 342.

The select input of each multiplexer determines which of the two data inputs of the multiplexer is selected to propagated to the output of the multiplexer. For example, to control the first level multiplexers during an clock cycle A, select signal generator 340 generates a select 1 signal 344 that may select wire signals a, c when select 1 signal 344 is a logic low value and that may alternatively select wire signals b, d when select 1 signal 344 is a logic high value. Similarly, during clock cycle A, select signal generator 342 generates a select 1 signal 346 that may select wire signals e, g when select 1 signal 346 is a logic low value and that may alternatively select wire signals f, h when select 1 signal 346 is a logic high value. Accordingly, selection circuit 301 may select one of wire signal a or wire signal b during clock cycle A.

Selection circuit 301 further includes a multitude of flip-flops 348, 350, 352, 354, 356, 358, 360, 362, 364, 366 that are added to circuit design 205 to function as synchronous storage and delay elements in the configurable logic chip. Each of the multitude of flip-flops 348, 350, 352, 354, 356, 358, 360, 362, 364, 366 includes a data input D, a data output Q, and a clock input depicted as a small triangle that will be understood by those of average skill in the art to be connected to clock signal ck. For each FF in accordance with a portion of a clock cycle, such as a rising edge of clock signal ck, the value present on data input D will be synchronously stored on data output Q and delaying that value by one clock cycle.

During clock cycle A, e.g. when FF 348 receives the rising edge of clock cycle A on clock signal ck, FF 348 will store a value associated with the selected signal from multiplexer output 332 on data output Q 368. Similarly during clock cycle A, FF 350 will store a value associated with the selected signal from multiplexer output 334 on data output Q 370, FF 354 will store a value associated with the selected signal from multiplexer output 336 on data output Q 374, and FF 356 will store a value associated with the selected signal from multiplexer output 338 on data output Q 376.

To synchronously control the second level multiplexers, select signal generator 340 generates a select 2 signal 378 to control multiplexer 318 via FF 352 and select signal generator 342 generates a select 2 signal 380 to control multiplexer 320 via FF 358. During clock cycle A, e.g. when FF 352 receives the rising edge of clock cycle A on clock signal ck, FF 352 will store a value associated with select 2 signal 378 on data output Q 372. Similarly during clock cycle A, FF 358 will store a value associated with select 2 signal 380 on data output Q 378.

Then during clock cycle B, multiplexer 318 may select the value associated with multiplexer output 332 previously stored on data output Q 368 when the value associated with the select 2 signal 378 previously stored on data output Q 372 is a logic low value. Alternatively, multiplexer 318 may select the value associated with multiplexer output 334 stored on data output Q 370 when select 2 signal 378 stored on data output Q 372 is a logic high value. Similarly during clock cycle B, multiplexer 320 may select the value associated with multiplexer output 336 previously stored on data output Q 374 when select 2 signal 380 previously stored on data output Q 378 is a logic low value. Alternatively, multiplexer 320 may select the value associated with multiplexer output 338 stored on data output Q 376 when select 2 signal 380 stored on data output Q 378 is a logic high value. Accordingly, the selection function of the second level multiplexers is synchronously delayed by one clock cycle.

During clock cycle B, e.g. when FF 362 receives the rising edge of clock cycle B on clock signal ck, FF 362 will store a value associated with the selected signal from multiplexer output 342 on data output Q 384. Similarly during clock cycle B, FF 364 will store a value associated with the selected signal from multiplexer output 334 on data output Q 386.

To synchronously control the third level multiplexer, select signal generator 342 generates a select 3 signal 382 to control multiplexer 322 via FF 360 and via FF 366. During clock cycle A, e.g. when FF 360 receives the rising edge of clock cycle A on clock signal ck, FF 360 will store a value associated with select 3 signal 382 on data output Q 380. Then during clock cycle B, FF 366 will store the value associated with data output Q 380 (the previously stored select 3 signal 382) on data output Q 388.

Then during clock cycle C, multiplexer 322 may select multiplexer output 342 previously stored on data output Q 384 when select 3 signal 382 previously stored on data output Q 388 is a logic low value and that may alternatively select multiplexer output 344 stored on data output Q 386 when select 3 signal 382 previously stored on data output Q 388 is a logic high value. Then during clock cycle C, multiplexer 322 may send the selected value on output 324 of multiplexer 322 to the output pin, e.g. output socket 330 of the first configurable logic chip, e.g. FPGA 204₁. Accordingly, the selection function of the third level multiplexers is synchronously delayed by two clock cycles and selection circuit 301 provides the selected one of the multitude of wire signals a, b, c, d, e, f, g, h to output socket 330 synchronously during the third clock cycle after the two clock cycles delay.

If for each of the multitude of flip-flops 348, 350, 352, 354, 356, 358, 360, 362, 364, 366, the data input D is shorted to the data output Q, thereby removing any synchronous delays in selection circuit 301, then the resulting structure, hereinafter referred to as the "TDM multiplexer tree," may need to propagate the selected one of the multitude of wire signals a, b, c, d, e, f, g, h to output socket 330 during a single clock cycle of hardware emulator or prototype system 202. Forming such a TDM multiplexer tree structure in the CHL devices, e.g. FPGA₁ 204₁, is a major challenge when the number of wires assigned to a single physical socket is too large. Then, the TDM multiplexer tree structure may be very complex and large. Due to the high speeds generally involved in communication, the physical TDM supporting logic and circuitry should be physically mapped onto the CHL in close proximity of the physical CHL socket creating three potential problems.

First, there may be paths in the TDM multiplexer tree structure that are very long, such that the propagation latency constraint on one of these paths may be bigger than the allowed path latency of the CHL as dictated by the desired clock frequency that the CHL is to be driven with. In this case the mapped TDM multiplexer tree circuit will simply not function as intended in the CHL without undesirably slowing down hardware emulator or prototype system 202.

Second, the amount of physical CHL resources, e.g. the constraint on the number of logic elements, required to map the TDM multiplexer tree structure may be bigger than the resources locally available in the CHL in the proximity of the socket. Then, the multiplexing structure may simply be infeasible to realize, e.g. the mapping of circuit design 205 by compiler 210 may fail during compilation.

Third, there may be many inputs that need to drive the TDM multiplexer tree structure. The many inputs can cause a wiring congestion on the CHL that can be in the proximity of the multiplexing structure or this congestion can be even farther away. In the case that a large number of inputs are originating from the same far away location, there may be a constraint on the number of available long-distance wire resources of the CHL which may also be shared by other functions of the circuit. Long-distance wire resources propagate signals faster than other more numerous standard wire resources. With high likelihood, the lack of enough long-distance wire resources may be significantly the most common problem. In any case, congestion and lack of wire resources will make realizing the TDM multiplexer tree structure infeasible and again the compilation may fail.

In contrast, selection circuit 301 may overcome many if not all three of the problems associated with the TDM multiplexer tree described above. For example, assume that in order to successfully propagate the selected one of the multitude of wire signals a, b, c, d, e, f, g, h to output socket 330 during a single clock cycle requires a minimum of 90 ns for the TDM multiplexer tree without any flip flops, or a minimum of 30 ns propagation delay per logic stage due to the three levels of logic stages in the TDM multiplexer tree. Also assume that the minimum clock cycle period for FPGA₁ 204₁ is thereby set to 90 ns. Keeping the same 90 ns clock cycle period for selection circuit 301 greatly relieves timing constraints since there are now only one logic stages associated with each level of multiplexers and associated with the FF to latch the selected data during each clock period. Assuming the same 30 ns propagation delay per logic stage for selection circuit 301, then only 30 ns, e.g. 1×30 ns, are required by each stage of logic elements themselves leaving an excess of 60 ns available for additional signal timing propagation.

More significantly, now each of the multiplexer levels and associated delay elements for selection circuit 301 may be located farther away from output socket 330 by the significant distance it takes the selected signal to propagate for the additional 60 ns along a standard wire path resource. Thereby, configuring selection circuit 301 to select one of the multitude of wire signals a, b, c, d, e, f, g, h during clock cycle A, to store a value associated with the selected wire signal during clock cycle A, and to send the value to output socket 330 of FPGA₁ 204₁ during clock cycle B alleviates at least one constraint of FPGA₁ 204₁ such as the propagation latency constraint, the constraint on the number of logic elements in the proximity of output socket 330, and/or the constraint on the number of available long-distance wire resources.

Additionally, compiler 210 may divide selection circuit 301 into a multitude of portions each associated with a different one of a multitude of control circuits, e.g. select signal generator circuits such as select signal generator 340, 342, which enable dividing at least one of the multitude of levels of multiplexers to provide further flexibility and enable minimizing the three problems noted above. Each of the multitude of portions of selection circuit 301 may be distributed in dispersed locations on FPGA₁ 204₁ and located away from the immediate location of output socket 330.

For example, compiler 210 may add select signal generator 340 to control one portion of selection circuit 301 that includes multitude of multiplexers 310, 312, 318 and compiler 210 may add select signal generator 342 to control another portion of selection circuit 301 that includes multitude of multiplexers 314, 316, 320, 322. In other words, selection circuit 301 not only may selection circuit 301 be divided and located on $FPGA_1$ $204_1$ by separate levels and associated delay elements, but at least one level and its associated delay elements may further be divided and located on $FPGA_1$ $204_1$ by separate portions in accordance with a multitude of different control circuits, e.g. select signal generator 340, 342.

For example, compiler 210 may map select signal generator 340, multitude of multiplexers 310, 312, and associated multitude of storage/delay elements FF 348, 350, 352 into region A of $FPGA_1$ $204_1$. Compiler 210 may map select signal generator 342, multitude of multiplexers 314, 316, and associated multitude of storage/delay elements FF 354, 356, 358, 360 into region B of $FPGA_1$ $204_1$. Compiler 210 may map multiplexer 318, and associated storage/delay element FF 362 into region C of $FPGA_1$ $204_1$. Compiler 210 may map multiplexer 320, and associated multitude of storage/delay elements FF 364, 366 into region D of $FPGA_1$ $204_1$. Compiler 210 may map multiplexer 322, into region E of $FPGA_1$ $204_1$. Accordingly, multitude of regions A, B, C, D, E may each be physically mapped and located dispersed from one another thereby preventing crowding of circuit resources in the vicinity of output socket 330.

As depicted in FIG. 3, selection circuit 301 may be divided into three levels of multiplexers with FFs acting as storage/delay elements inserted between each level in order to select one of a multitude of 8 wire signals to propagate. However the invention is not limited to the number of levels of multiplexers. One of average skill in the art would readily understand that the advantages described above such as the excess time available for signal timing propagation improves (increases) as the number of levels (number of wire signals) increase.

Further, the invention is not limited to the order of operations discussed in reference to FIG. 3. For example, as depicted in FIG. 3, one of a first wire signal or a second wire signal are selected during clock cycle A, and the value associated with the selected wire signal is stored during that same clock cycle A, while sending the value to output socket 330 of the configurable logic chip occurs during a different clock cycle C after clock cycle A. However, as would be understood by one of average skill in the art, repositioning the FFs in selection circuit 301 may enable storing the value associated with the selected wire signal may occur during clock cycle A, then selecting one of a first wire signal or a second wire signal may occur during clock cycle C after clock cycle A and sending the value to output socket 330 of the configurable logic chip occurs during the same clock cycle C.

Selection circuit 301 operates over a multitude of cycles to perform the TDM operation by sequentially transmitting the multitude of wires over output socket 330 in a predetermined order. Accordingly, after selecting a first wire signal, storing a value associated with that first signal and sending that first value to output socket 330 during a clock cycle C, first selection circuit 301 may then select a second wire signal, store a value associated with that second wire signal and send that second value to output socket 330 during a clock cycle D after clock cycle C.

Figure 4:
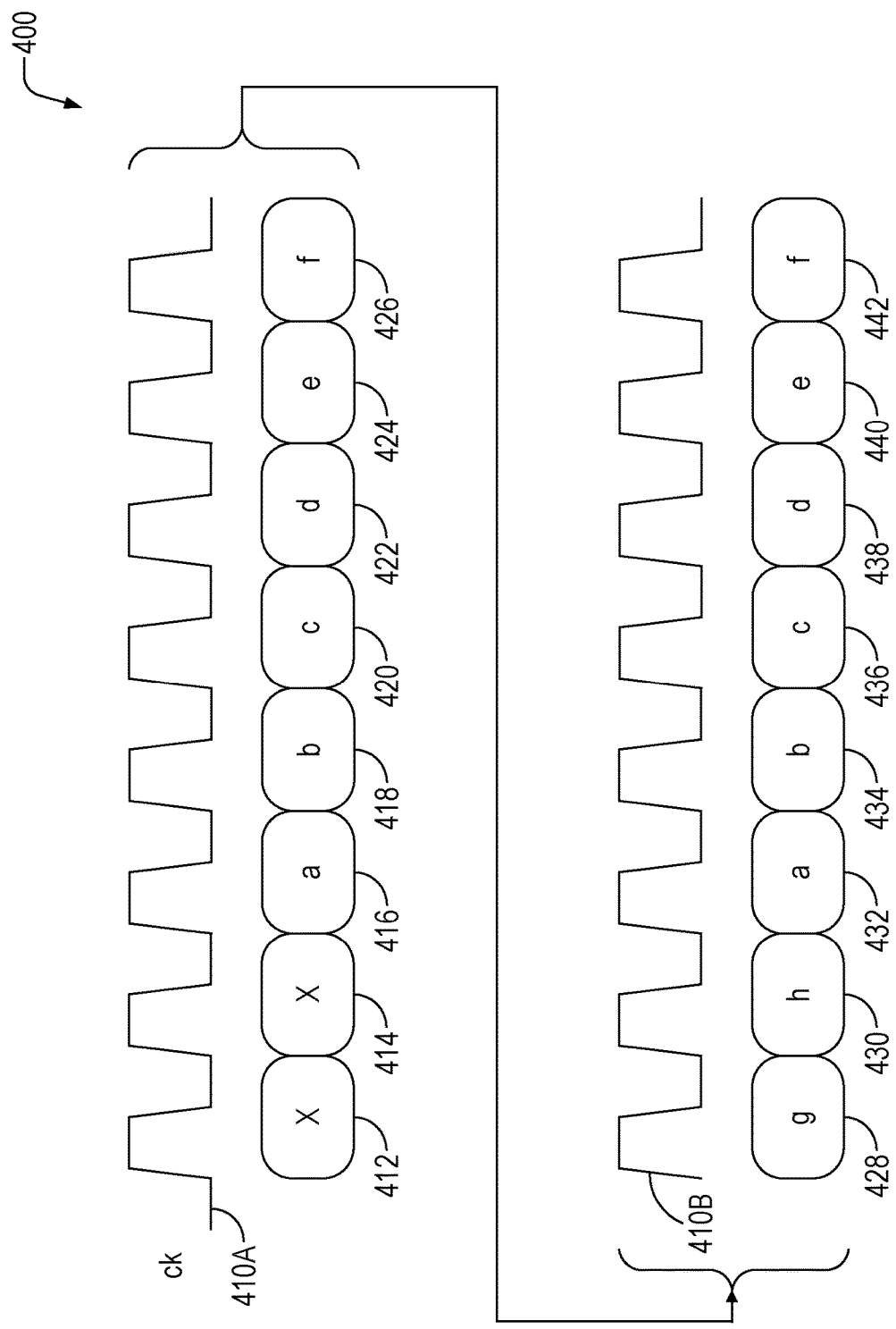
FIG. 4 depicts a representation of sequential data sent to an output socket by a selection circuit depicted in FIG. 3, in accordance with one embodiment of the present invention.

FIG. 4 depicts a representation of sequential data 400 sent to output socket 330 by selection circuit 301 depicted in FIG. 3, in accordance with one embodiment of the present invention. Referring simultaneously to FIG. 3 and FIG. 4, sequential data 400 depicts a multitude of 16 consecutive clock cycles 410A, 410B of clock signal ck. Each one of the multitude of 16 consecutive clock cycles 410A, 410B is associated with a different one of a multitude of data boxes 412, 414, 416, . . . , 440, 442. Each of the multitude of data boxes 416, 418, 420, . . . , 440, 442 are further associated with sending a value associated with each different one of the multitude of wire signals a, b, c, d, e, f, g, h selected by selection circuit 301 using TDM.

The initial two clock cycles are associated with data boxes 412, 414 and are depicted containing an "X" to indicate invalid data because the initial data is delayed by two clock cycles. It is observed that multitude of flip-flops 348, 350, 352, 354, 356, 358, 360, 362, 364, 366 are added to circuit design 205 in the multiplexer tree symmetrically, which means that the FFs are inserted or added in such a way that on any path between any leaf of the mux-tree and the root of the mux tree, the number of FFs (or the number of delay cycles) is the same. This number of FFs is called the "delay factor". Selection circuit 301 has a delay factor of 2. Accordingly, the initial data is delayed by two clock cycles so data boxes 412, 414 indicate invalid data "X". In other words, selection circuit 301 sends one value associated with the selected one of the multitude of wire signals a, b, c, d, e, f, g, h and another value associated with the next selected one of the multitude of wire signals a, b, c, d, e, f, g, h to output socket 330 of $FPGA_1$ $204_1$ in a predetermined order of clock cycles using TDM, such as sending wire signal a depicted in data box 416 immediately followed by wire signal b depicted in data box 418, after a clock cycle associated with an invalid value on output socket 330, such as the X depicted in data box 412.

The invalid data values may not be present in subsequent data communication after the values associated with the initial multitude of wire signals a, b, c, d, e, f, g, h are sent on output socket 330. For example, the next data box after data box 430 depicted as the value associated with wire signal h is data box 432 and is depicted as the value associated with wire signal a and not an invalid data X.

However, the invention is not limited to a symmetric multiplexer tree as discussed in reference to FIG. 3. For example, compiler 210 may configure selection circuit 301 to include a sub-selection circuit, such as multiplexer 318, configured to receive a selected wire signal from multiplexer 310 or a selected wire signal from multiplexer 312. Compiler 210 may further configure selection circuit 301 to include another sub-selection circuit, such as multiplexer 320, configured to receive a selected wire signal from multiplexer 314 or a selected wire signal from multiplexer 316. Compiler 210 may further configure selection circuit 301 to include a sub-selection circuit, such as multiplexer 322, configured to receive a selected signal from multiplexer 318 and another selected signal from multiplexer 320. Compiler 210 may further configure selection circuit 301 to send the selected value from multiplexer 322 to output socket 330 of $FPGA_1$ $204_1$. In a symmetric multiplexer tree example, compiler 210 may add a delay element, such as FF 362, to circuit design 205 between the multiplexer 318 and multiplexer 322, and add another delay element, such as FF 364, to circuit design 205 between multiplexer 320 and multiplexer 322. Compiler 210 may configure selection circuit 301 as a non-symmetric multiplexer tree. In a non-symmetric multiplexer tree example, compiler 210 may add a delay element, such as FF 362, to circuit design 205 between the multiplexer 318 and multiplexer 322, and couple multiplexer 320 to multiplexer 322 without adding any delay element therebetween.

The invalid data values may not be present in subsequent data communication after the values associated with the initial multitude of wire signals a, b, c, d, e, f, g, h are sent on output socket 330. For example, the next data box after data box 430 depicted as the value associated with wire signal h is data box 432 and is depicted as the value associated with wire signal a and not an invalid data X. It is noted that no gaps in the data are present save for the initial two cycles of invalid data X.

Figure 5:
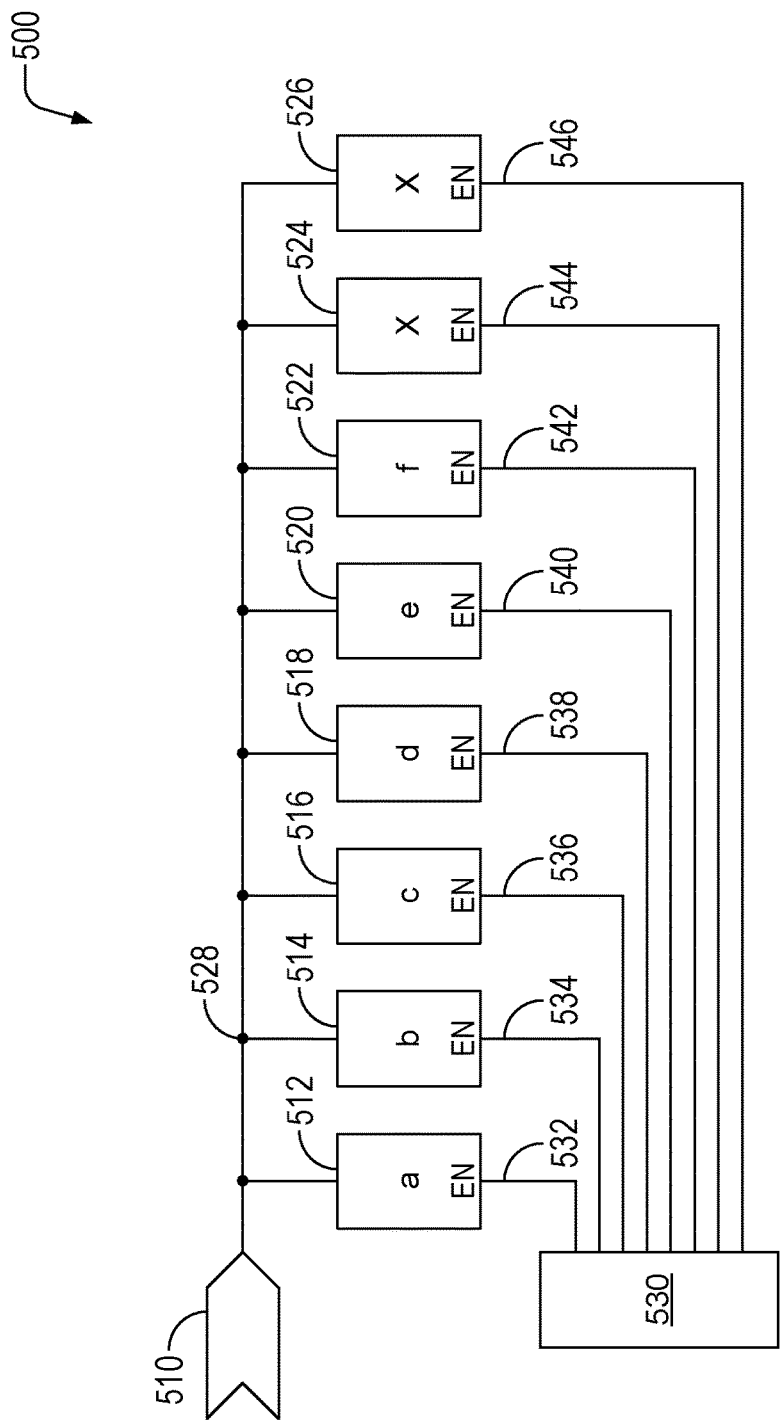
FIG. 5 depicts a simplified exemplary schematic of a receiving circuit associated with an input socket coupled to the output socket depicted in FIG. 3, in accordance with one embodiment of the present invention.

FIG. 5 depicts a simplified exemplary schematic of a receiving circuit 500 associated with an input socket 510 coupled to output socket 330 depicted in FIG. 3, in accordance with one embodiment of the present invention. Compiler 210 may partition a second portion of circuit design 205 to a second CHL, such as $FPGA_2$ $204_2$, of hardware emulator or prototype system 202 depicted in FIG. 2. Referring simultaneously to FIG. 2 and FIG. 5, compiler 210 may add receiving circuit 500 to circuit design 205 in $FPGA_2$ $204_2$. Receiving circuit 500 may further include a multitude of buffer registers 512, 514, ..., 524, 526 and a counter 530. The number of registers may be the same as the number of wire signals to be sent by TDM, which is 8 in this example.

Each of the multitude of buffer registers 512, 514, ..., 524, 526 may include a data input and an enable input. Each of the data inputs of the multitude of buffer registers 512, 514, ..., 524, 526 may be coupled in parallel to input socket 510 via signal 528. Counter 530 generates a multitude of enable control signals 532, 534, ..., 544, 548 each coupled to a different associated enable input of one of the multitude of buffer registers 512, 514, ..., 524, 526.

The data sequence is received into the multitude of buffer registers 512, 514, ..., 524, 526 with a cyclic write enable. Input socket 510 has the ability to write to any of the multitude of buffer registers 512, 514, ..., 524, 526. The write is controlled by the multitude of enable control signals 532, 534, ..., 544, 548. Counter 530 is cyclic and when counter 530 reaches its highest value (in this example that highest value is 7), counter 530 returns to 0. The buffer register that is written to is specified by the value of counter 530 as represented by the count value associated with the multitude of enable control signals 532, 534, ..., 544, 548.

Referring simultaneously to FIG. 4 and FIG. 5, in order to deal with the initial two cycles of invalid data X as depicted in multitude of data boxes 412, 414, compiler 210 initializes counter 530 with an initial start value determined by subtracting the delay factor from the value zero "0". Because the delay factor is 2 the start value is "0" subtracted by 2 or in other words the start value is "6". The resulting state of the buffer after 8 initial cycles includes the value associated with wire signal a in buffer register 512, the value associated with wire signal b in buffer register 514. Similarly, the value associated with wire signals c, d, e, f are respectively in buffer registers 516, 518, 520, 522. In this case the last 2 buffer registers 544, 546 are invalid data X, but after 2 more cycles the value 'g' and 'h' will be written respectively to buffer registers 544, 546. Thereby, receiving circuit 500 may receive the selected value associated with one of the multitude of wire signals a, b, c, d, e, f, g, h at input socket 510 of $FPGA_2$ $204_2$ during clock cycle C after at least one clock cycle associated with an invalid value on input socket 510.

Adding delay elements, e.g. multitude of flip-flops 348, 350, 352, 354, 356, 358, 360, 362, 364, 366 also adds more clock cycles to some paths of mapped circuit design 205 during emulation compared to a multiplexer tree having a delay factor of zero (0), hence requiring to reduce the frequency of emulated circuit design 205. In one embodiment, the frequency adjustment of emulated circuit design 205 may include adding to the period of emulated circuit design 205 having a delay factor of zero (0), the product of the latency of a single CHL FF, e.g. the original 90 ns clock period without extra FFs, times the delay factor. For example, assuming the 90 ns FF latency time used above or the 90 ns clock cycle period, and a delay factor of 2, then each cycle of emulation is may be extended by 2×90 ns of time providing an emulation cycle period of 90 ns+180 ns=270 ns.

Other techniques for achieving the functions of the selection and receiving circuit may be used. It is thus understood that embodiments of the present invention are not limited to any particular selection and receiving circuit module and that many such modules may exist that accomplish the same functions.

Detailed Description—Technology Support

General Computer Explanation

FIGS. 6A, 6B and 6C are simplified block diagrams of a computer system suitable for use with embodiments of the technology, as well as circuit design and circuit embodiments of the technology.

In FIG. 6A, computer system 3110 typically includes at least one computer or processor 3114 which communicates with a number of peripheral devices via bus subsystem 3112. Typically, the computer can include, or the processor can be, any of a microprocessor, graphics processing unit, or digital signal processor, and their electronic processing equivalents, such as an Application Specific Integrated Circuit (ASIC) or Field Programmable Gate Array (FPGA). The terms 'processor' and 'computer' are further defined below. These peripheral devices may include a storage subsystem 3124, comprising a memory subsystem 3126 and a file storage subsystem 3128, user interface input devices 3122, user interface output devices 3120, and a network interface subsystem 3116. The input and output devices allow user interaction with computer system 3110.

The computer system may be a server computer, a client computer, a workstation, a mainframe, a personal computer (PC), a tablet PC, a set-top box (STB), a personal digital assistant (PDA), a cellular telephone, a smartphone, a web appliance, a rack-mounted "blade", a kiosk, a television, a game station, a network router, switch or bridge, or any data processing machine capable of executing instructions 124 (sequential or otherwise) that specify actions to be taken by that machine.

The computer system typically includes an operating system, such as Microsoft's Windows, Sun Microsystems's Solaris, Apple Computer's MacOs, Linux or Unix. The computer system also typically can include a Basic Input/Output System (BIOS) and processor firmware. The operating system, BIOS and firmware are used by the processor to control subsystems and interfaces connected to the processor. Typical processors compatible with these operating systems include the Pentium and Itanium from Intel, the Opteron and Athlon from Advanced Micro Devices, and the ARM processor from ARM Holdings.

Innovations, embodiments and/or examples of the claimed inventions are neither limited to conventional computer applications nor the programmable apparatus that run them. For example, the innovations, embodiments and/or examples of what is claimed can include an optical computer, quantum computer, analog computer, or the like. The computer system may be a multi-processor or multi-core system and may use or be implemented in a distributed or remote system. The term 'processor' here is used in the broadest sense to include a singular processor and multi-core or multi-processor arrays, including graphic processing units, digital signal processors, digital processors and combinations of these devices. Further, while only a single computer system or a single machine may be illustrated, the use of a singular form of such terms shall also signify any collection of computer systems or machines that individually or jointly execute instructions 124 to perform any one or more of the sets of instructions discussed herein. Due to the ever-changing nature of computers and networks, the description of computer system 3110 depicted in FIG. 31A is intended only as one example for purposes of illustrating the preferred embodiments. Many other configurations of computer system 3110 are possible having more or less components than the computer system depicted in FIG. 31A.

Network interface subsystem 3116 provides an interface to outside networks, including an interface to communication network 3118, and is coupled via communication network 3118 to corresponding interface devices in other computer systems or machines. Communication network 3118 may comprise many interconnected computer systems, machines and communication links. These communication links may be wireline links, optical links, wireless links, or any other devices for communication of information. Communication network 3118 can be any suitable computer network, for example a wide area network such as the Internet, and/or a local area network such as Ethernet. The communication network can be wired and/or wireless, and the communication network can use encryption and decryption methods, such as is available with a virtual private network. The communication network uses one or more communications interfaces, which can receive data from, and transmit data to, other systems. Embodiments of communications interfaces typically include an Ethernet card, a modem (e.g., telephone, satellite, cable, or ISDN), (asynchronous) digital subscriber line (DSL) unit, Firewire interface, USB interface, and the like. One or more communications protocols can be used, such as HTTP, TCP/IP, RTP/RTSP, IPX and/or UDP.

User interface input devices 3122 may include an alphanumeric keyboard, a keypad, pointing devices such as a mouse, trackball, touchpad, stylus, or graphics tablet, a scanner, a touchscreen incorporated into the display, audio input devices such as voice recognition systems or microphones, eye-gaze recognition, brainwave pattern recognition, and other types of input devices. Such devices can be connected by wire or wirelessly to a computer system. In general, use of the term "input device" is intended to include all possible types of devices and ways to input information into computer system 3110 or onto communication network 3118. User interface input devices typically allow a user to select objects, icons, text and the like that appear on some types of user interface output devices, for example, a display subsystem.

User interface output devices 3120 may include a display subsystem, a printer, a fax machine, or non-visual displays such as audio output devices. The display subsystem may include a cathode ray tube (CRT), a flat-panel device such as a liquid crystal display (LCD), a projection device, or some other device for creating a visible image such as a virtual reality system. The display subsystem may also provide non-visual display such as via audio output or tactile output (e.g., vibrations) devices. In general, use of the term "output device" is intended to include all possible types of devices and ways to output information from computer system 3110 to the user or to another machine or computer system.

Memory subsystem 3126 typically includes a number of memories including a main random-access memory (RAM) 3130 (or other volatile storage device) for storage of instructions and data during program execution and a read only memory (ROM) 3132 in which fixed instructions are stored. File storage subsystem 3128 provides persistent storage for program and data files, and may include a hard disk drive, a floppy disk drive along with associated removable media, a CD-ROM drive, an optical drive, a flash memory, or removable media cartridges. The databases and modules implementing the functionality of certain embodiments may be stored by file storage subsystem 3128.

Bus subsystem 3112 provides a device for letting the various components and subsystems of computer system 3110 communicate with each other as intended. Although bus subsystem 3112 is shown schematically as a single bus, alternative embodiments of the bus subsystem may use multiple busses. For example, RAM-based main memory can communicate directly with file storage systems using Direct Memory Access (DMA) systems.

FIG. 6B depicts a memory 3140 such as a non-transitory, computer readable data and information storage medium associated with file storage subsystem 3128, and/or with network interface subsystem 3116, and can include a data structure specifying a circuit design. The memory 3140 can be a hard disk, a floppy disk, a CD-ROM, an optical medium, removable media cartridge, or other medium that stores computer readable data in a volatile or non-volatile form. Software read into a computer from such a memory can be converted at a selected instance in time from a tangible form to a transmission signal that is propagated through a medium (such as a network, connector, wire, or trace as an electrical pulse or a medium such as space or an atmosphere as electromagnetic radiation with wavelengths in the electromagnetic spectrum longer than infrared light).

FIG. 6C signifies an integrated circuit 3190 created with the described technology that includes one or more cells selected, for example, from a cell library.

Detailed Description—Technology Support

Hardware/Software Equivalence

Some of the innovations, embodiments and/or examples described herein comprise and/or use a processor. As used herein, the term 'processor' signifies a tangible data and information processing device that physically transforms data and information, typically using a sequence transformations (also referred to as 'operations'). Data and information can be physically represented by an electrical, magnetic, optical or acoustical signal that is capable of being stored, accessed, transferred, combined, compared, or otherwise manipulated by the processor. The term "processor" can signify a singular processor and multi-core systems or multi-processor arrays, including graphic processing units, digital signal processors, digital processors or combinations of these elements.

The processor can be electronic, for example, comprising digital logic circuitry (for example, binary logic), or analog (for example, an operational amplifier). The processor can also be non-electronic, for example, as seen in processors based on optical signal processing, DNA transformations or quantum mechanics, or a combination of technologies, such as an optoelectronic processor. For data and information structured in binary form, any processor that can transform the data and information using the AND, OR and NOT logical operations (and their derivatives, such as the NAND, NOR, and XOR operations) can transform the data and information using any function of Boolean logic. A processor such as an analog neural network processor can also transform data and information non-digitally. There is no scientific evidence that any of these processors are processing, storing and retrieving data and information, in any manner or form equivalent to the bioelectric structure of the human brain.

The one or more processors may also operate to support performance of the relevant operations in a 'cloud computing' environment or as a 'software as a service' (SaaS). For example, at least some of the operations may be performed by a group of processors available at a distributed or remote system, these processors accessible via a communications network (e.g., the Internet) and via one or more software interfaces (e.g., an application program interface (API).)

As used herein, the term 'module' signifies a tangible data and information processing device, which typically is limited in size and/or complexity. For example, the term 'module' can signify one or more methods or procedures that can transform data and information. The term 'module' can also signify a combination of one or more methods and procedures in a computer program. The term 'module' can also signify a small network of digital logic devices, in which interconnections of the logic devices give structure to the network. Methods and procedures comprising a module, specified in a specialized language, such as System C, can be used to generate a specification for a network of digital logic devices that process data and information with exactly the same results as are obtained from the methods and procedures.

A module can be permanently configured (e.g., hardwired to form hardware), temporarily configured (e.g., programmed with software), or a combination of the two configurations (for example, a structured ASIC). Permanently configured modules can be manufactured, for example, using Application Specific Integrated Circuits (ASICs) such as Arithmetic Logic Units (ALUs), Programmable Logic Arrays (PLAs), or Read Only Memories (ROMs), all of which are typically configured during manufacturing. Temporarily configured modules can be manufactured, for example, using Field Programmable Gate Arrays (FPGAs—for example, sold by Xilink or Intel's Altera), Random Access Memories (RAMs) or microprocessors. A module is configured to process data and information, typically using a sequence transformations (also referred to as 'operations') applied to the data and information (or in the case of ROMs and RAMS, transforming data and information by using the input information as an address for memory that stores output data and information), to perform aspects of the present innovations, embodiments and/or examples of the invention.

Modules that are temporarily configured need not be configured at any one instance in time. For example, a processor comprising one or more modules can have the modules configured at different times. The processor can comprise a set of one or more modules at one instance of time, and to comprise a different set of one or modules at a different instance of time. The decision to manufacture or implement a module in a permanently configured form, a temporarily configured form, or a combination of the two forms, may be driven by cost, time considerations, engineering constraints and/or specific design goals. The "substance" of a module's processing is independent of the form in which it is manufactured or implemented.

As used herein, the term 'algorithm' signifies a process comprising a sequence or set of operations or instructions that a module can use to transform data and information to achieve a result. A module can comprise one or more algorithms. As used herein, the term 'thread' refers to a sequence of instructions that can comprise a subset of the instructions of an entire process or algorithm. A process or algorithm can be partitioned into multiple threads that can be executed in parallel.

As used herein, the term 'computer' includes at least one information processor that, for example, can perform certain operations such as (but not limited to) the AND, OR and NOT logical operations using electronic gates that can comprise transistors, with the addition of memory (for example, memory based on flip-flops using the NOT-AND or NOT-OR operation). Such a processor is said to be Turing-complete or computationally universal. A computer, whether or not it is a digital computer, typically comprises many modules.

As used herein, the term 'software' or 'program' signifies one or more algorithms and data structures that configure a processor for use in the innovations, embodiments and examples described in this specification. Such devices configurable by software include one or more computers, for example, standalone, client or server computers, or one or more hardware modules, or systems of one or more such computers or modules. As used herein, the term "software application" signifies a set of data and instructions that configure the processor to achieve a specific result, for example, to perform word processing operations, or to encrypt a set of data.

As used herein, the term 'programming language' signifies a grammar and syntax for specifying sets of instruction and data that comprise software. Programming languages include assembler instructions, instruction-set-architecture (ISA) instructions, machine instructions, machine dependent instructions, microcode, firmware instructions, state-setting data, or either source code or object code written in any combination of one or more higher level languages, such as conventional procedural programming languages, for example, the "C" programming language or similar programming languages (such as SystemC), or object oriented programming language such as Smalltalk, C++ or the like, and any future equivalent programming languages.

Software is entered into, equivalently, read into, one or memories of the computer or computer system from a data and information storage device. The computer typically has a device for reading storage media that is used to transport the software, or has an interface device that receives the software over a network. This process is discussed in the General Computer Explanation section.

Detailed Description—Technology Support

EDA System/Workflow Explanation

FIG. 1 illustrates various processes performed in the design, verification and fabrication of an item of manufacture such as an integrated circuit using software tools with a computer, and possibly special hardware-assisted tools, to transform and verify design data and instructions that represent the integrated circuit. These processes start with the generation of a product idea 110 with information supplied by a designer, information which is transformed during a process to create an item of manufacture (referred to herein as a design or device) that uses an EDA software tool 112, which may also be signified herein as EDA software, as a design tool, or a verification tool. When the design is finalized, it can be taped-out 134, which typically is when artwork (e.g., geometric patterns) for the integrated circuit is sent to a fabrication facility, to fabricate the mask set, which is then used for fabricating the integrated circuit. After tape-out, a semiconductor die is fabricated 136 and packaging and assembly processes 138 are performed, which result in the finished integrated circuit 140 which may also be signified herein as a circuit, device, component, chip or SoC (System on Chip).

Items of manufacture, for example, a circuit or system are used in commerce at a variety of levels of abstraction ranging from low-level transistor layouts to high-level description languages. Most designers start at high-level of abstraction to design their circuits and systems, using a hardware description language (HDL) such as VHDL, Verilog, SystemVerilog, SystemC, MyHDL or OpenVera. The high-level HDL is easier for developers to comprehend, especially for a vast system, and may describe highly complex concepts that are difficult to grasp using a lower level of abstraction. The HDL description may be converted into other levels of abstraction as is helpful to the developers. For example, a high-level description may be converted to a logic-level register transfer level (RTL) description, a gate-level (GL) description, a layout-level description, or a mask-level description. Each lower abstraction level introduces more detail into the design description. The lower-levels of abstraction may be generated automatically by computer, derived from a design library, or created by another design automation technique. An example of a specification language at a lower level of abstraction is SPICE, much used detailed descriptions of analog-based circuits.

A design process that uses an EDA software tool 112 includes tools 114-132, which are described below. This design flow description is for illustration purposes only and is not meant to limit the present disclosure. For example, an actual integrated circuit design may require a designer to perform the design operations in a different sequence than the sequence described herein.

During system design 114, a designer describes the functionality to be manufactured. The designer can also perform what-if planning to refine the functionality and to check costs, etc. Hardware-software architecture partitioning can occur at this stage. Exemplary EDA software products from Synopsys, Inc. of Mountain View, Calif., that can be used at this stage include: Model Architect, Saber, System Studio, and Designware products.

During logic design and functional verification 116, modules in the circuit are specified in one or more hardware description languages, or HDLs, and the design in HDL is checked for functional accuracy, that is, to match the requirements of the specification of the circuit or system being designed. More specifically, the design is checked to ensure that it produces the correct outputs. Exemplary HDL languages are Verilog, VHDL and SystemC. Functional verification is typically done by using software-based simulators and other tools such as testbench generators, static HDL checking tools and formal verification tools. In some situations, special hardware referred to as 'emulators' or prototyping systems' are used to speed up the functional verification. Exemplary EDA software products from Synopsys, Inc. of Mountain View, Calif. that can be used at this stage include: VCS, Vera, Designware, Magellan, Formality, ESP and Leda products. Exemplary emulator and prototyping products also available from Synopsys that can be used at this state include: Zebu® and Protolink® (®="Registered Trademark").

During logic synthesis and design for test 118, HDL code is translated to a netlist. This netlist can be optimized for the target technology. Additionally, tests can be designed and implemented to check the finished integrated circuit. Exemplary EDA software products from Synopsys, Inc. of Mountain View, Calif. that can be used at this stage include: Design Compiler, Physical Compiler, Test Compiler, Power Compiler, FPGA Compiler, Tetramax, and Designware products.

During netlist verification 120, the netlist is checked for compliance with timing constraints and for correspondence with the HDL code. Exemplary EDA software products from Synopsys, Inc. of Mountain View, Calif. that can be used at this stage include: Formality, Primetime, and VCS products.

During design planning 122, an overall floor plan for the integrated circuit is constructed and analyzed for timing and top-level routing. Exemplary EDA software products from Synopsys, Inc. of Mountain View, Calif. that can be used at this stage include: Astro and IC Compiler products.

During layout implementation 124, the physical placement (positioning of circuit elements such as transistors or capacitors) and routing (connection of the same by a multitude of conductors) occurs, as can selection of library cells to perform specific logic functions. Exemplary EDA software products from Synopsys, Inc. of Mountain View, Calif. that can be used at this stage include: the Astro and IC Compiler products.

During analysis and extraction 126, the circuit function is verified at the layout level, which permits refinement of the layout design. Exemplary EDA software products from Synopsys, Inc. of Mountain View, Calif. that can be used at this stage include: Astrorail, Primerail, Primetime, and Star RC/XT products.

During physical verification 128, the layout design is checked to ensure correctness for manufacturing constraints such as DRC constraints, electrical constraints, lithographic constraints, and circuitry function matching the HDL design specification. Exemplary EDA software products from Synopsys, Inc. of Mountain View, Calif. that can be used at this stage include the Hercules product.

During resolution enhancement 130, geometric manipulations of the layout are performed to improve manufacturability of the design. Exemplary EDA software products from Synopsys, Inc. of Mountain View, Calif. that can be used at this stage include: Proteus products.

During tape-out, data is created to be used (after lithographic enhancements are applied if appropriate) for production of lithography masks. Example EDA software products from Synopsys, Inc., that can be used during tape-out include the IC Compiler and Custom Designer families of products.

During mask-data preparation 132, the 'tape-out' data is used to produce lithography masks that are used to produce finished integrated circuits. Exemplary EDA software products from Synopsys, Inc. of Mountain View, Calif. that can be used at this stage include the CATS family of products.

For all of the above mentioned integrated circuit design tools, similar tools from other EDA vendors, such as Cadence, Siemens, other corporate entities or various non-commercial tools from universities, or open source repositories, can be used as an alternative.

Embodiments of the present disclosure can be used during one or more of the above-described stages. Specifically, some embodiments of the present disclosure can be used in EDA software 112.

A storage subsystem is preferably used to store the programs and data structures that provide the functionality of some or all of the EDA tools described herein, and tools applied for development of cells for the library and for physical and logical design using the library. These programs and data structures are generally executed by one or more processors in a manner known to those of ordinary skill in the art.

Detailed Description—Technology Support

Emulation Environment Explanation

An EDA software system, such as element 112 depicted in FIG. 1, typically includes an emulation system 116 to verify the functionality of the circuit design. FIG. 2 depicts a typical emulation system which includes a host computer system 300 (often part of an EDA system) and an emulator system 202 (typically a set of programmable devices such as Field Programmable Gate Arrays (FPGAs)). The host system generates data and information, typically using a compiler 210, to configure the emulator to emulate a circuit design. One of more circuit designs to be emulated are referred to as a DUT (Design Under Test) 205. The emulator is a hardware system that emulates a DUT, for example, to use the emulation results for verifying the functionality of the DUT. One example of an emulation system that can be used for the embodiments disclosed herein is the ZeBus Server available from Synopsys, Inc.

The host system 300 can comprise one or more processors. In the embodiment where the host system is comprised of multiple processors, the functions described herein as being performed by the host system may be distributed among the multiple processors.

The host system 300 typically includes a compiler 210 that processes code written in a hardware description language that represents a DUT, producing data (typically binary) and information that is used to configure the emulation system 202 to emulate the DUT. The compiler 210 may transform, change, reconfigure, add new functions to, and/or control the timing of the DUT.

The host system and emulator exchange data and information using signals carried by an emulation connection. The connection can be one or more electrical cables, for example, cables with pin configurations compatible with the RS232 or USB protocols. The connection can be a wired communication medium or network, such as a local area network, or a wide area network such as the Internet. The connection can be a wireless communication medium or a network with one or more points of access, using a wireless protocol such as Bluetooth® or IEEE 802.11. The host system and emulator can exchange data and information through a third device, such as a network server.

The emulator includes multiple FPGAs (or other programmable devices), for example, elements $204_1$ to $204_N$ in FIG. 2. Each FPGA can include one or more FPGA interfaces through which the FPGA is connected to other FPGAs of the emulator (and potentially other emulator hardware components), in order for the FPGAs to exchange signals. An FPGA interface may also be referred to as an input/output pin or an FPGA pad. While some embodiments disclosed herein make use of emulators comprising FPGAs, other embodiments can include other types of logic blocks instead of or along with, the FPGAs for emulating DUTs, for example, custom FPGAs, specialized ASICs for emulation or prototyping, memories, and input/output devices.

A programmable device may include an array of programmable blocks and a hierarchy of reconfigurable interconnects that allow the programmable blocks to be connected to each other according to the descriptions in the HDL code. Each of the programmable blocks can be configured to perform complex combinational functions, or merely simple logic functions, such as AND, and XOR.

In many FPGAs, the blocks also include memory elements, which may be simple latches, flip-flops or more complex blocks of memory. Depending on the length of the interconnections between different logic blocks, signals may arrive at input terminals of the blocks at different times.

Programmable processors $204_1$-$204_N$ may be placed into one or more hardware boards $212_1$ through $212_M$. Many of Such Boards May be Placed into a Hardware Unit, e.g. $214_1$. The boards within a unit may be connected using the backplane of the unit or any other types of connections. In addition, multiple hardware units (e.g., $214_1$ through $214_K$) may be connected to each other by cables or any other means to form a multi-unit system. In general, the hardware emulation or prototype system 202 may be formed using a single board, a single unit with multiple boards, or with multiple units without departing from the teachings of the present disclosure.

For a DUT that is to be emulated, the emulator receives from the host system one or more bit files including a description of the DUT. The bit files further specify partitions of the DUT created by the host system with trace and injection logic, mappings of the partitions to the FPGAs of the emulator, and design constraints. Based on the bit files, the emulator configures the FPGAs to perform the functions of the DUT. With some emulators, one or more FPGAs of an emulator already have the trace and injection logic built into the silicon of the FPGA. For this type of emulator, the FPGAs don't have to be configured by the host system to emulate trace and injection logic.

The host system 300 receives (e.g., from a user) a description of a DUT that is to be emulated. In one embodiment, the DUT description is in a hardware description language (HDL), such as register transfer language (RTL). In another embodiment, the DUT description is in netlist level files, or a mix of netlist level files and HDL files. If part of the DUT description or the entire DUT description is in a HDL, the host system synthesizes the DUT description to create a gate level netlist based on the DUT description. A host system can use the netlist of the DUT to partition the DUT into multiple partitions, with some of these partitions including trace and injection logic. The trace and injection logic traces interface signals exchanged via the interfaces of an FPGA. Additionally, the trace and injection logic can be used to inject traced interface signals into the logic of the FPGA. The host system maps each partition to an FPGA of the emulator. With some emulators, the trace and injection logic is only included in select partitions for a group of FPGAs. The trace and injection logic can be built into one or more of the FPGAs of an emulator. The host system can synthesize multiplexers to be mapped into the FPGAs. The multiplexers can be used by the trace and injection logic to inject interface signals into the DUT logic.

The host system creates bit files describing each partition of the DUT and the mapping of the partitions to the FPGAs. For partitions in which trace and injection logic was incorporated, the bit files also describe the incorporation of the logic. The bit files may also include place and route information and design constraints. The host system stores the bit files and also stores for components of the DUT information describing which FPGAs are to emulate each component of the DUT (to which FPGAs each component is mapped).

Upon request, the host system transmits the bit files to the emulator. The host system instructs the emulator to emulate the DUT. During emulation of the DUT or at the end of the emulation, the host system receives emulation results from the emulator through the emulation connection. Emulation results are data and information generated by the emulator based on the emulation of the DUT. The emulation results include interface signals (states of interface signals) traced by the trace and injection logic of each FPGA. The host system can stores the emulation results, or transmit them to another processing system.

After emulation of the DUT, a user may request to debug a component of the DUT. If such a request is made the user may provide a time period of the emulation to debug. The host system identifies which FPGAs are configured to emulate the component based on the stored information. The host system retrieves stored interface signals associated with the time period and traced by the trace and injection logic of each identified FPGA. The host system instructs the emulator to re-emulate the identified FPGAs, either one by one, multiple at a time, or altogether. The host system transmits the retrieved interface signals to the emulator in order to re-emulate the component for the time period. The trace and injection logic of each identified FPGA injects its respective interface signals received from the host system into the logic of the DUT mapped to the FPGA. In case of multiple re-emulations of an FPGA, the results may be merged all together to have a full debug view.

The host system receives from the emulator signals traced by logic of the identified FPGAs during the re-emulation of the component. The host system stores the signals received from the emulator. The signals traced during the re-emulation can have a higher sampling rate than during the initial emulation. For example, in the initial run a traced signal may be comprised of a saved hardware state every X milliseconds. However, in the re-emulation the traced signal may be comprised of a saved hardware state every Y milliseconds, where Y is less than X. If the user requests to view a waveform of a signal traced during the re-emulation, the host system can retrieve the stored signal and display a plot of the signal (generates a waveform of the signal). Afterwards the user can, for example, request to re-emulate the same component but for a different time period or to re-emulate another component.

A host system typically comprises at least seven sub-systems: a design synthesizer, a mapping module, a run time module, a results module, a debug module, a waveform module, and a storage module. Each of these sub-systems may be embodied as hardware, software, firmware, or a combination thereof. Together these components configure the emulator, and monitor the emulation results.

The design synthesizer converts the HDL of a DUT into gate level logic. For a DUT that is to be emulated, the design synthesizer receives a description of the DUT. If the description of the DUT is fully or partially in HDL (e.g., RTL or other level of abstraction), the design synthesizer 210 synthesizes the HDL of the DUT to create a gate-level netlist with a description of the DUT in terms of gate level logic.

The mapping module partitions DUTs and maps partitions to emulator FPGAs. The mapping module partitions a DUT at the gate level into a number of partitions using the netlist of the DUT. For each partition, the mapping module retrieves a gate level description of the trace and injection logic and incorporates the logic into the partition. As described above, the trace and injection logic included in a partition is configured to trace signals exchanged via the interfaces of an FPGA to which the partition is mapped (trace interface signals). The trace and injection logic can be incorporated into the DUT prior to the partitioning. For example, the trace and injection logic may be incorporated by the design synthesizer prior to or after the synthesizing the HDL of the DUT. Hence, the trace and injection logic may not match the partitions, it may be a subset, a superset or even different from the partitions.

In addition to including the trace and injection logic, the mapping module may include additional tracing logic in a partition in order to trace the states of certain DUT components that are not traced by the trace and injection logic (to trace signals other than the interface signals traced by the trace and injection logic). The mapping module may include the additional tracing logic in the DUT prior to the partitioning or in partitions after the partitioning. The design synthesizer can include the additional tracing logic in an HDL description of the DUT prior to synthesizing the description.

The mapping module maps each partition of the DUT to an FPGA of the emulator. The mapping module performs the partitioning and mapping using design rules, design constraints (e.g., timing or logic constraints), and information about the emulator. For components of the DUT, the mapping module stores information in the storage module describing which FPGAs are to emulate each component.

Based on the partitioning and the mapping, the mapping module generates one or more bit files that describe the created partitions and the mapping of logic to each FPGA of the emulator. The bit files may include additional information, such as constraints of the DUT, and routing information of connections between FPGAs and connections within each FPGA. The mapping module can generate a bit file for each partition of the DUT, which can be stored in the storage module. Upon request from a user, the mapping module transmits the bit files to the emulator, which the emulator uses to configure the FPGAs to emulate the DUT.

If the emulator includes specialized ASICs that include the trace and injection logic, the mapping module may generate a specific configuration allowing to connect them to the DUT or just save the information of what traced/injected signal is and where the information is stored on the specialized ASIC.

The run time module controls emulations performed on the emulator. The run time module may cause the emulator to start or stop executing an emulation. Additionally, the run time module may provide input signals/data to the emulator. The input signals may be provided directly to the emulator through the connection or indirectly through other input signal devices. For example, the host system with the run time module may control an input signal device to provide the input signals to the emulator. The input signal device may be, for example, a test board (directly or through cables), signal generator, another emulator, or another host system.

The results module processes emulation results generated by the emulator. During emulation and/or after completing the emulation, the results module receives emulation results from the emulator generated during the emulation. The emulation results include signals traced during the emulation. Specifically, the emulation results include interface signals traced by the trace and injection logic emulated by each FPGA. The emulation results may also include signals traced by additional logic included in the DUT. Each traced signal can span multiple cycles of the emulation. A traced signal is comprised of multiple hardware states and each hardware state is associated with a time of the emulation. The results module stores the traced signals received in the storage module. For each stored signal, the results module can store information indicating which FPGA generated the traced signal.

The debug module allows users to debug DUT components. After the emulator has emulated a DUT and the results module has received the interface signals traced by the trace and injection logic during the emulation, a user may request to debug a component of the DUT by re-emulating the component for a specific time period. In a request to debug a component, the user identifies the component and indicates a time period of the emulation to debug. The user's request can also include a sampling rate that indicates how often hardware states should be saved by logic that traces signals.

The debug module identifies the one or more FPGAs of the emulator that are configured to emulate the component based on the information stored by the mapping module in the storage module. For each identified FPGA, the debug module retrieves, from the storage module, interface signals traced by the trace and injection logic of the FPGA during the time period indicated by the user (i.e., retrieve hardware states traced by the trace and injection logic that are associated with the time period).

The debug module transmits the retrieved interface signals to the emulator. The debug module instructs the debug module to run the identified FPGAs and for the trace and injection logic of each identified FPGA to inject its respective traced signals into logic of the FPGA in order to re-emulate the component for the requested time period. The debug module can also transmit the sampling rate provided by the user to the emulator so that the tracing logic traces hardware states at the proper intervals.

To debug the component, the emulator only has to run the FPGAs to which the component has been mapped. Additionally, the re-emulation of the component does not have to start from the beginning, but can start at any point desired by the user.

For an identified FPGA, the debug module can transmit instructions to the emulator to load multiple emulator FPGAs with the same configuration of the identified FPGA. The debug module additionally instructs the emulator to run the multiple FPGAs in parallel. Each FPGA from the multiple FPGAs is run with a different time window of the interface signals in order to generate a larger time window in a shorter amount of time. For example, for the identified FPGA to run a certain amount of cycles it may take an hour. However, if multiple FPGAs are loaded with the configuration of the identified FPGA and each of the FPGAs runs a subset of the cycles, it may only take a few minutes for the FPGAs to collectively run all of the cycles.

A user may identify a hierarchy or a list of DUT signals to re-emulate. To enable this, the debug module determines the FPGA needed to emulate the hierarchy or list of signals, retrieves the necessary interface signals and transmits the retrieved interface signals to the emulator for re-emulation. Hence, a user can identify any element (e.g., component or signal) of the DUT to debug/re-emulate.

The waveform module generates waveforms based on traced signals. If a user requests to view a waveform of a signal traced during an emulation run, the host system retrieves the signal from the storage module. The waveform module displays a plot of the signal to the user. For one or more signals, when the signals are received from the emulator, the waveform module can automatically generate the plots of the signals.

Detailed Description—Conclusion

The foregoing Detailed Description signifies in isolation the individual features, structures, functions, or characteristics described herein and any combination of two or more such features, structures, functions or characteristics, to the extent that such features, structures, functions or characteristics or combinations thereof are based on the present specification as a whole in light of the knowledge of a person skilled in the art, irrespective of whether such features, structures, functions or characteristics, or combinations thereof solve any problems disclosed herein, and without limitation to the scope of the claims. When an embodiment of a claimed invention comprises a particular feature, structure, function or characteristic, it is within the knowledge of a person skilled in the art to use such feature, structure, function, or characteristic in connection with other embodiments whether or not explicitly described, for example, as a substitute for another feature, structure, function or characteristic.

In view of the foregoing Detailed Description it will be evident to a person skilled in the art that many variations may be made within the scope of innovations, embodiments and/or examples, such as function and arrangement of elements, described herein without departing from the principles described herein. One or more elements of an embodiment may be substituted for one or more elements in another embodiment, as will be apparent to those skilled in the art. The embodiments described herein were chosen and described to signify the principles of the invention and its useful application, thereby enabling others skilled in the art to understand how various embodiments and variations are suited to the particular uses signified.

The foregoing Detailed Description of innovations, embodiments, and/or examples of the claimed inventions has been provided for the purposes of illustration and description. It is not intended to be exhaustive nor to limit the claimed inventions to the precise forms described, but is to be accorded the widest scope consistent with the principles and features disclosed herein. Obviously, many variations will be recognized by a person skilled in this art. Without limitation, any and all equivalents described, signified or incorporated by reference in this patent application are specifically incorporated by reference into the description herein of the innovations, embodiments and/or examples. In addition, any and all variations described, signified or incorporated by reference herein with respect to any one embodiment are also to be considered taught with respect to all other embodiments. Any such variations include both currently known variations as well as future variations, for example any element used herein includes a future equivalent element that provides the same function, regardless of the structure of the future equivalent.

It is intended that the scope of the claimed inventions be defined and judged by the following claims and equivalents. The following claims are hereby incorporated into the Detailed Description, with each claim standing on its own as a separate embodiment. Disclosed embodiments can be described with more features than are expressly recited in the claims.

What is claimed:

1. A method of performing hardware emulation of a circuit design, the method comprising:

partitioning a first portion of the circuit design to a first configurable logic chip of a hardware emulator;
adding a selection circuit to the circuit design in the first configurable logic chip;
selecting one of a first signal or a second signal during a first clock cycle, wherein the first signal and the second signal are used in the circuit design;
storing a first value associated with the selected signal during a second clock cycle;
sending the first value to an output pin of the first configurable logic chip during a third clock cycle;
storing a second value associated with the selected signal, wherein the first value is associated with the first signal and the second value is associated with the second signal; and
sending the second value to the output pin of the first configurable logic chip during a fourth clock cycle after the third clock cycle.

2. The method of claim 1 further comprising:
sending the first value and the second value to the output pin of the first configurable logic chip in a predetermined order of clock cycles after a clock cycle associated with an invalid value on the output pin.

3. The method of claim 1 further comprising:
using time division multiplexing to send the first value and the second value to the output pin of the first configurable logic chip after a clock cycle associated with an invalid value on the output pin.

4. A method of performing hardware emulation of a circuit design, the method comprising:
partitioning a first portion of the circuit design to a first configurable logic chip of a hardware emulator;
adding a selection circuit to the circuit design in the first configurable logic chip;
selecting one of a first signal or a second signal during a first clock cycle, wherein the first signal and the second signal are used in the circuit design;
storing a first value associated with the selected signal during a second clock cycle;
sending the first value to an output pin of the first configurable logic chip during a third clock cycle;
adding a first delay element to the circuit design in the first configurable logic chip; and
storing the first value on an output of the first delay element.

5. The method of claim 4 further comprising:
adjusting a clock period of the hardware emulation by adding to a first clock period the product of the total number of delay elements along a path from the first signal to the output pin times a latency time associated with one of the delay elements.

6. The method of claim 4, wherein the first delay element is a flip flop that synchronously stores on an output of the flip flop the first value present at an input of the flip flop in accordance with a clock signal.

7. A method of performing hardware emulation of a circuit design, the method comprising:
partitioning a first portion of the circuit design to a first configurable logic chip of a hardware emulator;
adding a selection circuit to the circuit design in the first configurable logic chip;
selecting one of a first signal or a second signal during a first clock cycle, wherein the first signal and the second signal are used in the circuit design;
storing a first value associated with the selected signal during a second clock cycle;
sending the first value to an output pin of the first configurable logic chip during a third clock cycle;
configuring the selection circuit to include:
a first sub-selection circuit configured to receive the first signal and the second signal;
a second sub-selection circuit configured to receive a third signal and a fourth signal, wherein the third signal and the fourth signal are used in the circuit design; and
a third sub-selection circuit configured to receive a first selected signal from the first sub-selection circuit and a second selected signal from the second sub-selection circuit; and
sending the first value from the third sub-selection circuit to the output pin of the first configurable logic chip.

8. The method of claim 7 further comprising:
adding a first delay element to the circuit design between the first sub-selection circuit and the third sub-selection circuit; and
adding a second delay element to the circuit design between the second sub-selection circuit and the third sub-selection circuit.

9. The method of claim 7 further comprising:
adding a first delay element to the circuit design between the first sub-selection circuit and the third sub-selection circuit; and
coupling the second sub-selection circuit to the third sub-selection circuit without adding any delay element therebetween.

10. The method of claim 7 further comprising:
adding a first control circuit to the circuit design configured to control the first sub-selection circuit; and
adding a second control circuit to the circuit design configured to control the second sub-selection circuit, wherein the second control circuit is different from the first control circuit.

11. A method of performing hardware emulation of a circuit design, the method comprising:
partitioning a first portion of the circuit design to a first configurable logic chip of a hardware emulator;
adding a selection circuit to the circuit design in the first configurable logic chip;
selecting one of a first signal or a second signal during a first clock cycle, wherein the first signal and the second signal are used in the circuit design;
storing a first value associated with the selected signal during a second clock cycle;
sending the first value to an output pin of the first configurable logic chip during a third clock cycle;
partitioning a second portion of the circuit design to a second configurable logic chip of the hardware emulator;
adding a receiver circuit to the circuit design in the second configurable logic chip; and
receiving the first value at an input pin of the second configurable logic chip during the third clock cycle after a clock cycle associated with an invalid value on the input pin.

12. A hardware emulation system configured to:
partition a first portion of the circuit design to a first configurable logic chip of a hardware emulator;
add a selection circuit to the circuit design in the first configurable logic chip;
select one of a first signal or a second signal during a first clock cycle, wherein the first signal and the second signal are used in the circuit design;
store a first value associated with the selected signal during a second clock cycle;

send the first value to an output pin of the first configurable logic chip during a third clock cycle;
store a second value associated with the selected signal, wherein the first value is associated with the first signal and the second value is associated with the second signal; and
send the second value to the output pin of the first configurable logic chip during a fourth clock cycle after the third clock cycle.

13. The hardware emulation system of claim 12 further configured to:
send the first value and the second value to the output pin of the first configurable logic chip in a predetermined order of clock cycles after a clock cycle associated with an invalid value on the output pin.

14. The hardware emulation system of claim 12 further configured to:
use time division multiplexing to send the first value and the second value to the output pin of the first configurable logic chip after a clock cycle associated with an invalid value on the output pin.

15. A hardware emulation system configured to:
partition a first portion of the circuit design to a first configurable logic chip of a hardware emulator;
add a selection circuit to the circuit design in the first configurable logic chip;
select one of a first signal or a second signal during a first clock cycle, wherein the first signal and the second signal are used in the circuit design;
store a first value associated with the selected signal during a second clock cycle;
send the first value to an output pin of the first configurable logic chip during a third clock cycle;
add a first delay element to the circuit design in the first configurable logic chip; and
store the first value on an output of the first delay element.

16. The hardware emulation system of claim 15 further configured to:
adjust a clock period of the hardware emulation by adding to a first clock period the product of the total number of delay elements along a path from the first signal to the output pin times a latency time associated with one of the delay elements.

17. The hardware emulation system of claim 15, wherein the first delay element is a flip flop adapted to synchronously store on an output of the flip flop the first value present at an input of the flip flop in accordance with a clock signal.

18. A hardware emulation system configured to:
partition a first portion of the circuit design to a first configurable logic chip of a hardware emulator;
add a selection circuit to the circuit design in the first configurable logic chip;
select one of a first signal or a second signal during a first clock cycle, wherein the first signal and the second signal are used in the circuit design;
store a first value associated with the selected signal during a second clock cycle;
send the first value to an output pin of the first configurable logic chip during a third clock cycle;
wherein the selection circuit is configured to include:
a first sub-selection circuit configured to receive the first signal and the second signal;
a second sub-selection circuit configured to receive a third signal and a fourth signal, wherein the third signal and the fourth signal are used in the circuit design; and
a third sub-selection circuit configured to receive a first selected signal from the first sub-selection circuit and a second selected signal from the second sub-selection circuit; and
send the first value from the third sub-selection circuit to the output pin of the first configurable logic chip.

19. The hardware emulation system of claim 18 further configured to:
add a first delay element to the circuit design between the first sub-selection circuit and the third sub-selection circuit; and
add a second delay element to the circuit design between the second sub-selection circuit and the third sub-selection circuit.

20. The hardware emulation system of claim 18 further configured to:
add a first delay element to the circuit design between the first sub-selection circuit and the third sub-selection circuit; and
couple the second sub-selection circuit to the third sub-selection circuit without adding any delay element therebetween.

21. The hardware emulation system of claim 18 further configured to:
add a first control circuit to the circuit design configured to control the first sub-selection circuit; and
add a second control circuit to the circuit design configured to control the second sub-selection circuit, wherein the second control circuit is different from the first control circuit.

22. A hardware emulation system configured to:
partition a first portion of the circuit design to a first configurable logic chip of a hardware emulator;
add a selection circuit to the circuit design in the first configurable logic chip;
select one of a first signal or a second signal during a first clock cycle, wherein the first signal and the second signal are used in the circuit design;
store a first value associated with the selected signal during a second clock cycle;
send the first value to an output pin of the first configurable logic chip during a third clock cycle;
partition a second portion of the circuit design to a second configurable logic chip of the hardware emulator;
add a receiver circuit to the circuit design in the second configurable logic chip; and
receive the first value at an input pin of the second configurable logic chip during the third clock cycle after a clock cycle associated with an invalid value on the input pin.

* * * * *